US011495536B2

(12) United States Patent
Chang et al.

(10) Patent No.: US 11,495,536 B2
(45) Date of Patent: Nov. 8, 2022

(54) SEMICONDUCTOR STRUCTURE AND METHOD FOR FORMING THEREOF

(71) Applicant: TAIWAN SEMICONDUCTOR MANUFACTURING COMPANY LTD., Hsinchu (TW)

(72) Inventors: Jen-Yuan Chang, Hsinchu (TW); Chia-Ping Lai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 93 days.

(21) Appl. No.: 17/103,650

(22) Filed: Nov. 24, 2020

(65) Prior Publication Data

US 2022/0165664 A1    May 26, 2022

(51) Int. Cl.

| H01L 23/52 | (2006.01) |
| H01L 23/525 | (2006.01) |
| H01L 23/48 | (2006.01) |
| H01L 23/522 | (2006.01) |
| H01L 23/528 | (2006.01) |
| H01L 23/00 | (2006.01) |
| H01L 23/58 | (2006.01) |

(52) U.S. Cl.
CPC ........ *H01L 23/5258* (2013.01); *H01L 23/481* (2013.01); *H01L 23/5223* (2013.01); *H01L 23/5286* (2013.01); *H01L 23/585* (2013.01); *H01L 24/08* (2013.01); *H01L 24/80* (2013.01); *H01L 2224/08145* (2013.01); *H01L 2224/80895* (2013.01); *H01L 2224/80896* (2013.01)

(58) Field of Classification Search
CPC combination set(s) only.
See application file for complete search history.

(56) References Cited

U.S. PATENT DOCUMENTS

| 9,549,461 | B2 * | 1/2017 | Toyama | H05K 1/0231 |
| 10,951,248 | B1 * | 3/2021 | Kamgaing | H04B 1/0075 |
| 2017/0373002 | A1 * | 12/2017 | Lee | H01L 23/5225 |
| 2022/0192042 | A1 * | 6/2022 | Kabir | H01L 25/0657 |

FOREIGN PATENT DOCUMENTS

EP    3840042 A1 *  6/2021 ....... H01L 21/76838

* cited by examiner

*Primary Examiner* — Niki H Nguyen
(74) *Attorney, Agent, or Firm* — WPAT Law; Anthony King

(57) ABSTRACT

A semiconductor structure and a method for forming the semiconductor structure are disclosed. The method includes receiving a first integrated circuit component having a seal ring and a fuse structure, wherein the fuse structure is electrically connected to a ground through the seal ring; receiving a second integrated circuit component having a first capacitor; bonding the second integrated circuit component to the first integrated circuit component; electrically connecting the first capacitor to the fuse structure, wherein the first capacitor is electrically connected to the ground through the fuse structure; and blowing the fuse structure after a treatment.

20 Claims, 23 Drawing Sheets

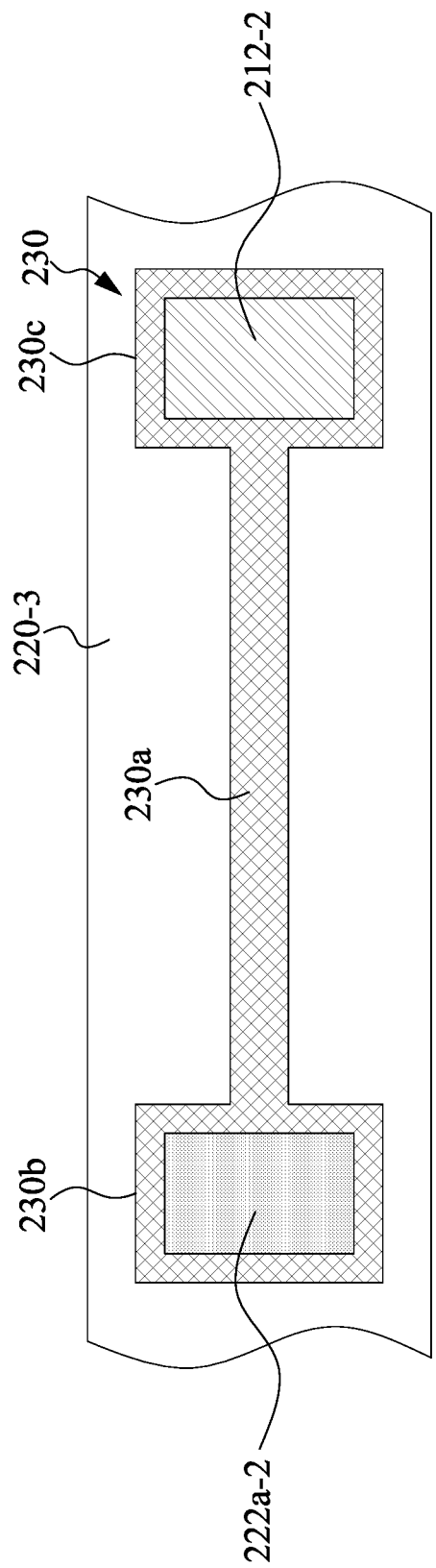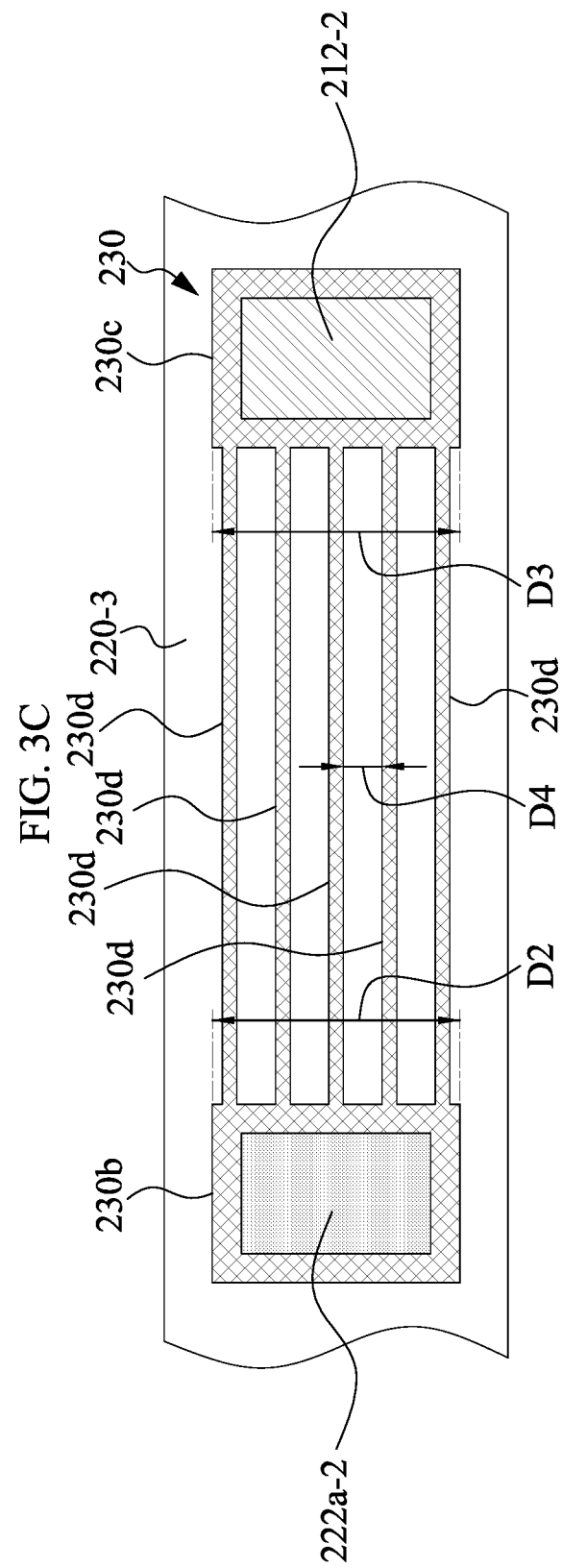
FIG. 3C
FIG. 3D

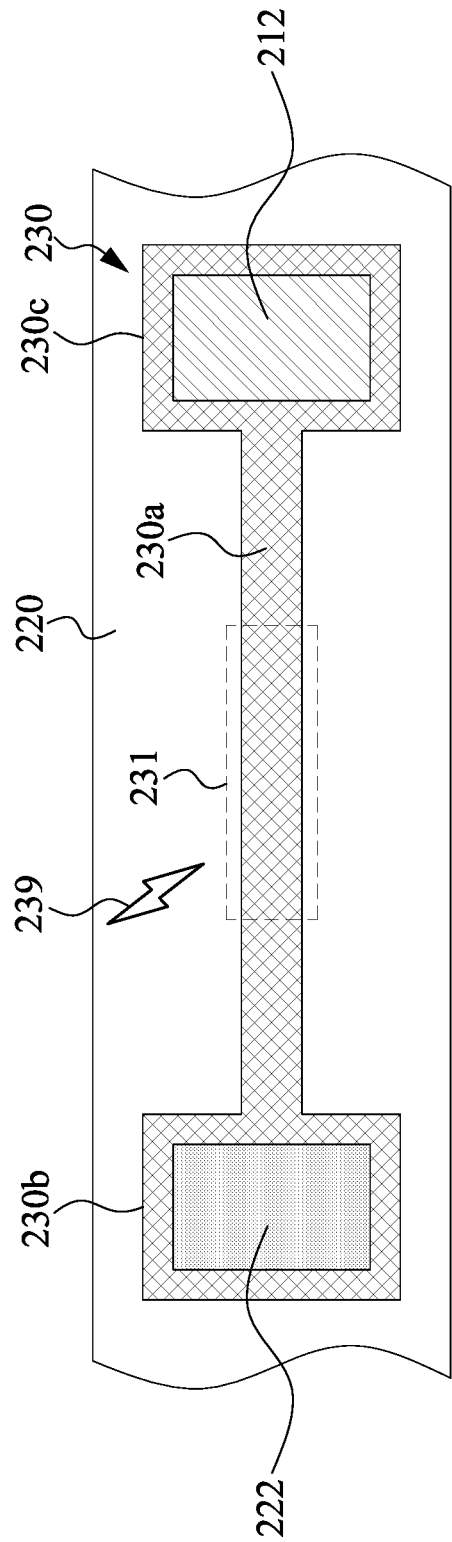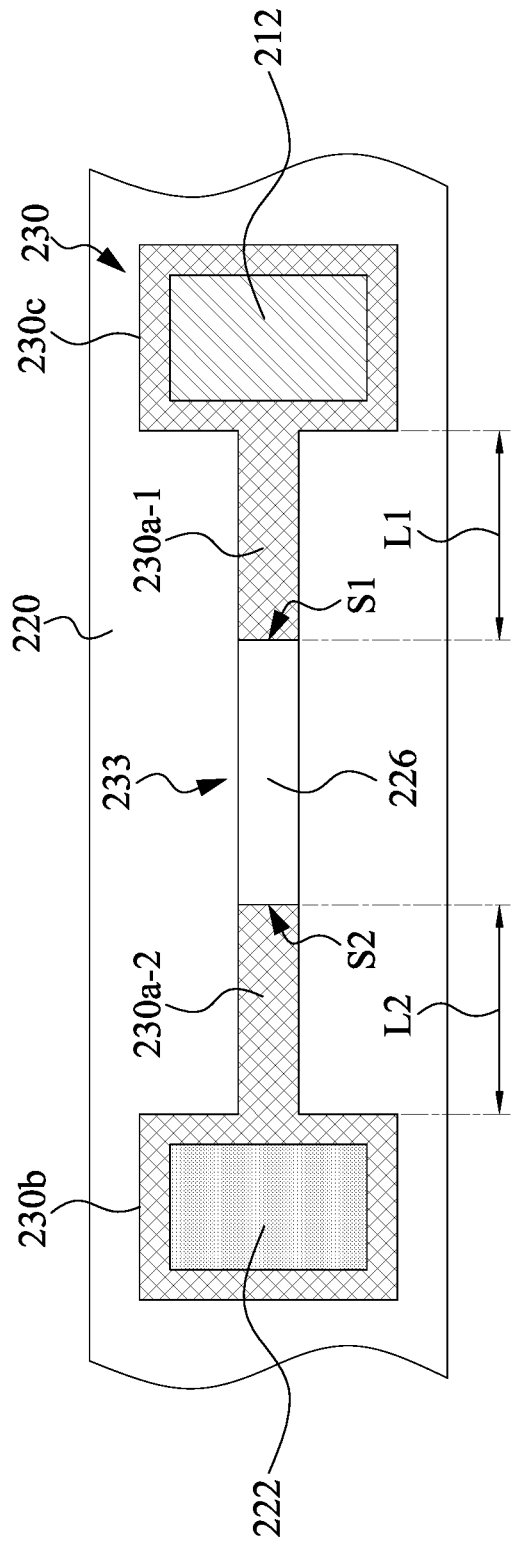
FIG. 17A
FIG. 17B

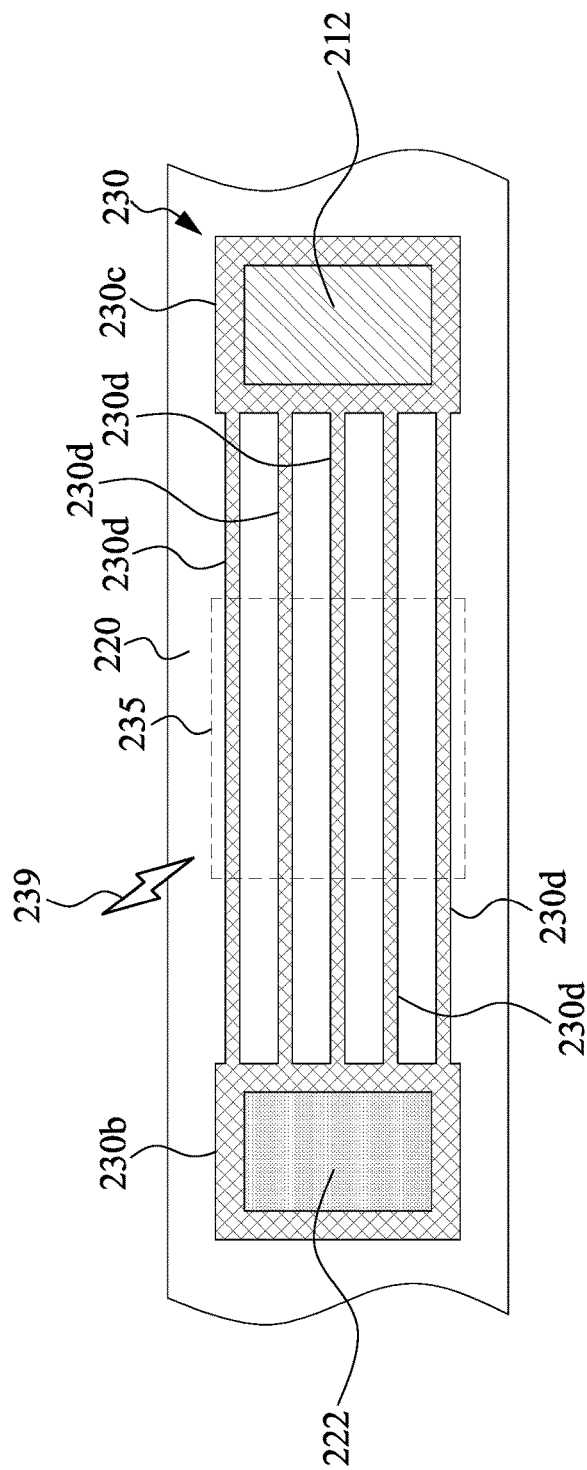
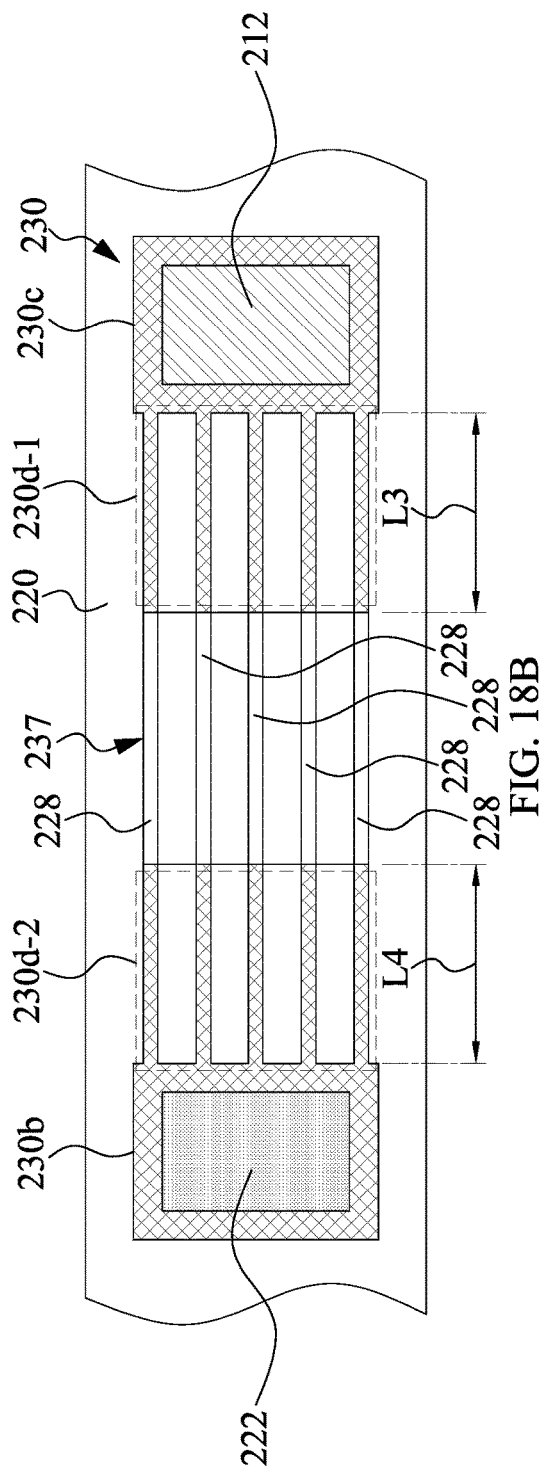
FIG. 18A
FIG. 18B

SEMICONDUCTOR STRUCTURE AND METHOD FOR FORMING THEREOF

BACKGROUND

Electronic equipment involving semiconductor devices is essential for many modern applications. Technological advances in materials and design have produced generations of semiconductor devices, in which each generation includes smaller and more complex circuits than the previous generation. The semiconductor integrated circuit (IC) industry has produced a wide variety of digital devices to address issues in a number of different areas. Semiconductor packages have been introduced in which more device dies are integrated in one package to achieve more functions.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3I) are schematic top views of a fuse structure, in accordance with some embodiments of the present disclosure.

FIGS. 17A-17B are schematic top views showing different statuses of a fuse structure before and after blowing, respectively, in accordance with some embodiments of the present disclosure.

FIGS. 18A-18B are schematic top views showing different statuses of a fuse structure before and after blowing, respectively, in accordance with some embodiments of the present disclosure.

DETAILED DESCRIPTION

Figure 1:
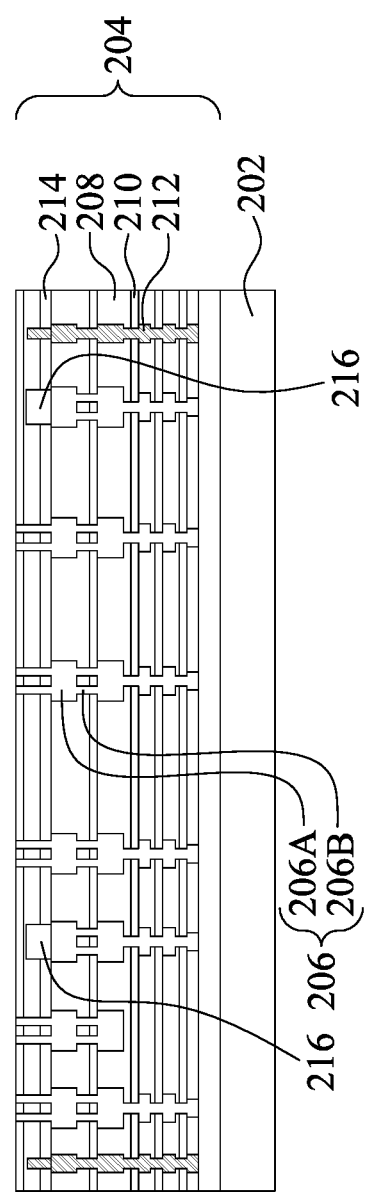
FIGS. 1, 2, and 4-16 are schematic cross-sectional views showing various stages in a method for forming a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

A semiconductor package structure includes a plurality of active and passive device dies. Active devices such as bipolar and field effect transistors are configured to implement specific functionalities. Passive devices such as resistors, capacitors and inductors are used to improve electrical performance of the electrical circuit. The passive and active devices may be formed as dies and are electrically connected, enabling advanced applications with reduced device size and less power consumption. In some examples, during the integration of the device dies, some processing steps may lead to, for example, charge accumulation in the electrically floating structures in the passive device dies, and thus adversely influence electrical performance of the semiconductor package.

In one or more embodiments of the present disclosure, a method for forming a semiconductor structure including a fuse structure is provided. The fuse structure may be disposed in a device die. The fuse structure in the device die is configured to electrically connect the electrically floating structure in the passive device die to ground. After the semiconductor device is completed, the fuse structure is blown to restore the function of the passive device die. Thus, the charges accumulated in the electrically floating structure may be discharged through the fuse structure during the manufacturing process, thereby protecting the semiconductor package from charge-induced damages.

FIGS. 1, 2 and 4 through 16 are schematic cross-sectional views showing various stages in a method for forming a semiconductor structure 100, iii accordance with some embodiments of the present disclosure. In some embodiments, the semiconductor structure 100 is a semiconductor package. In some embodiments, the semiconductor structure 100 is a system-on-integrated-circuit (SoIC) package structure, an integrated fan-out (InFO) package or a three-dimensional integrated circuit (3D IC). The semiconductor structure 100 may include a plurality of active and passive device dies.

Referring to FIG. 1, a substrate 202 is received or provided. The substrate 202 may be referred to gas a die substrate or a wafer. The substrate 202 may be a semiconductor substrate, such as a bulk semiconductor or the like, which may be doped (e.g., with a p-type or an n-type dopant) or undoped. In some embodiments, the substrate 202 is a silicon wafer. Alternatively, the substrate 202 may be a multi-layered substrate (e.g., a semiconductor-on-insulator (SUI) substrate), a gradient substrate, or the like. In some embodiments, a wide variety of electrical components (e.g., transistors, capacitors, inductors, resistors, combinations thereof, and the like) is used to meet the structural and functional requirements of the semiconductor structure 100. In some embodiments, the substrate 202 is free of through semiconductor vias depending on the design requirements.

An interconnection structure 204 is formed over the substrate 202. The interconnection structure 204 is configured to electrically connect its overlying components. In addition, the interconnection structure 204 is configured to electrically couple its overlying components with the electrical components of the substrate 202. The interconnection structure 204 may include one or more conductive patterns 206 embedded in one or more dielectric layers 208. The dielectric layers 208 may be referred to as inter-metallization dielectric (IMD) layer(s). In some embodiments, the dielectric layers 208 are formed of a low-K dielectric material, such as phosphosilicate glass (PSG), borophosphosilicate glass (BPSG), fluorosilicate glass (FSG) or the like. The conductive patterns 206 may include conductive lines 206A and conductive vias 206B. The conductive vias 206B respectively electrically connect the conductive lines 206A thereunder to the conductive lines 206A thereon. In some embodiments, the conductive lines 206A and the conductive vias 206B include conductive materials, such as W, Al, Cu, AlCu, and the like.

The interconnection structure 204 may further include etch stop layers 210 disposed between the dielectric layers 208. In some embodiments, the etch stop layers 210 are formed of a dielectric material, such as SiN, SiCN, SiCO, combinations thereof, or the like. In some embodiments, the etch stop layer 210 includes a multilayer structure, e.g., formed of a nitride layer and an oxide layer. In some embodiments, the interconnection structure 204 further includes barrier layers, such as formed of Ta or TaN, between the dielectric layers 208 and the conductive lines 206A or conductive vias 206B.

In some embodiments, the interconnection structure 204 further includes one or more seal rings 212. The seal ring 212 may be formed along a periphery of the interconnection structure 204. As illustrated in FIG. 1, the seal ring 212 is a continuous structure formed to laterally surround the interconnection structure 204. The seal ring 212 may be electrically connected to an electrical ground. The seal ring 212 may be formed of a conductive material. In some embodiments, the seal ring 212 is formed of a stack of conductive lines 206A and conductive vias 206B. In some embodiments, the stack of the seal ring 212 is formed of a same material of the conductive patterns 206. The seal ring 212 may be manufactured by a same process which forms the conductive patterns 206.

In some embodiments, the interconnection structure 204 further includes one or more passivation layers 214 and one or more conductive pads 216. The passivation layer 214 may be formed on a topmost layer of the interconnection structure 204. In some embodiments, the conductive pads 216 are at least partially disposed in the passivation layer 214. In some embodiments, the conductive pads 216 are formed in a metallization layer of the interconnection structure 204. In some embodiments, the conductive pads 216 formed over the substrate 202 are configured as test pads that allows for testing of the 3D packaging or 3DIC, e.g., by use of probes and/or probe cards, and the like. The passivation layer 214 may be a silicon oxide layer, a silicon nitride layer, a silicon oxy-nitride layer, or a dielectric layer formed by other suitable dielectric materials. The conductive pads 216 may include aluminum pads, copper pads, or other suitable metal pads.

Figure 2:
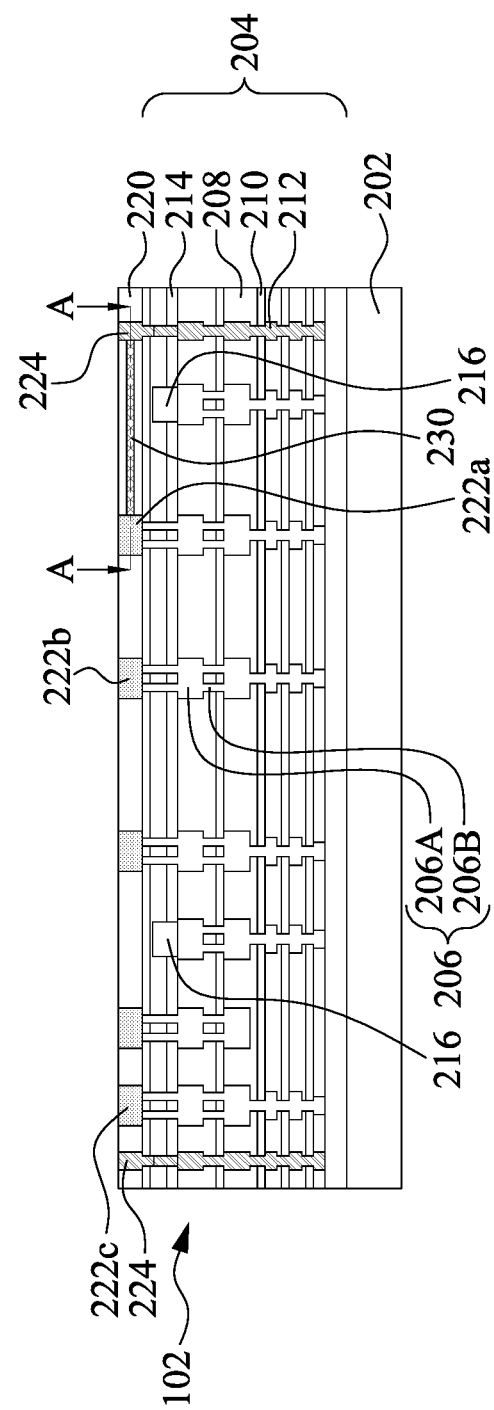

Referring to FIG. 2, a bonding layer 220 is formed over the interconnection structure 204. The substrate 202, the interconnection structure 204 and the bonding layer 220 altogether form a first integrated circuit component 102 (also referred to as a semiconductor die or a semiconductor wafer). The bonding layer 220 may be used as a bonding interface between the first integrated circuit component 102 and an overlying integrated circuit component, and may be bonded to another bonding layer on the overlying integrated circuit component discussed below. The bonding layer 220 may be formed of similar materials and by similar processes as those for the dielectric layers 208. The bonding layer 220 may include one or more bonding pads 222a, 222b, and 222c. The bonding pads 222a, 222b, and 222c may be formed of similar materials of the conductive patterns 206 and manufactured by similar processes as those for the conductive patterns 206, and thus the description are not repeated herein. The bonding layer 220 may further include one or more conductive patterns 224. The conductive patterns 224 may be electrically connected to the seal ring 212 in the interconnection structure 204 and serve as part of the seal ring 212.

A fuse structure 230 is formed in the bonding layer 220. The fuse structure 230 may be electrically connected to the seal ring 212. Alternatively, the fuse structure 230 may be electrically connected to the electrical ground through the seal ring 212. In some embodiments, the fuse structure 230 is kept shorted or is not blown yet during the processing of the first integrated circuit component 102. In some embodiments, the fuse structure 230 is blown after the processing of the first integrated circuit component 102. In some embodiments, the fuse structure 230 is formed in one metallization layer of the interconnection structure 204. In some embodiments, the fuse structure 230 is disposed in one or more dielectric layers 208.

Figure 3A:
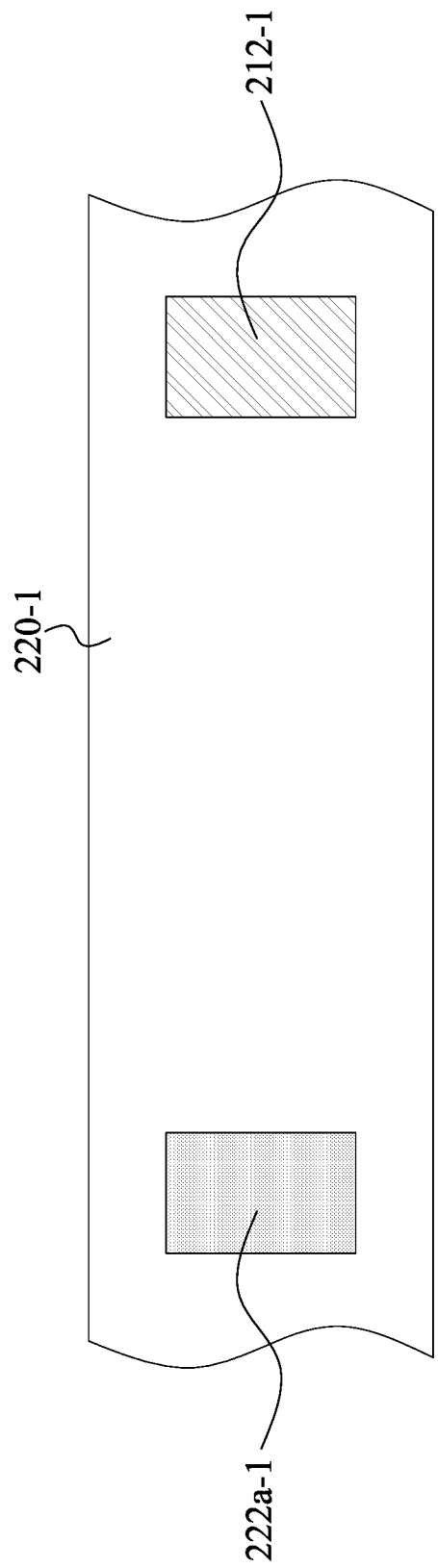
Figure 3B:
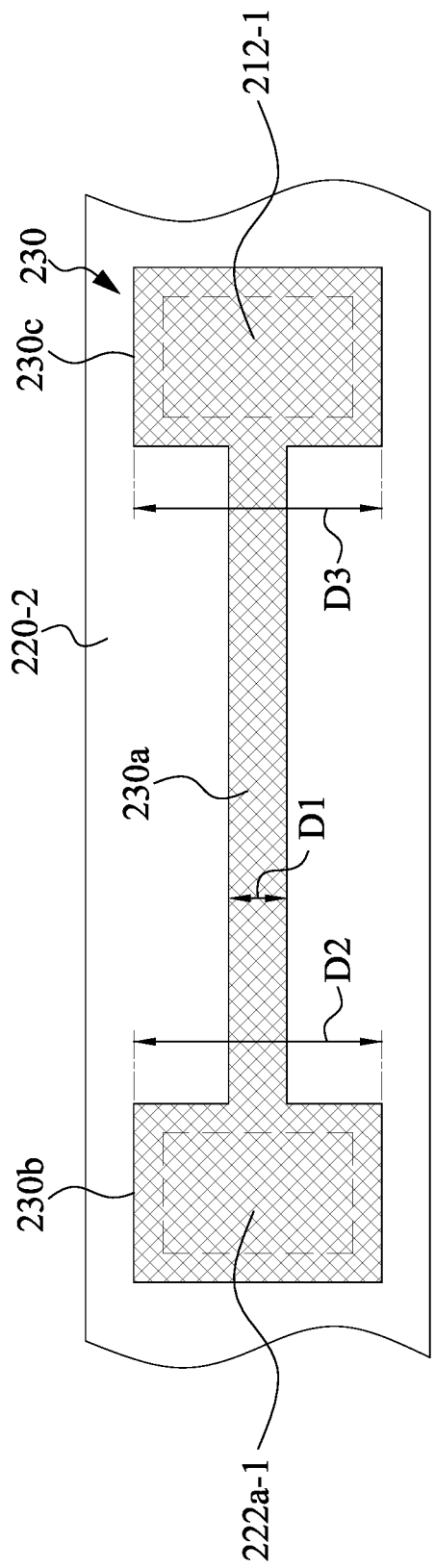

FIGS. 3A-3C are schematic top views of the fuse structure 230 along a section line AA in FIG. 2, in accordance with some embodiments of the present disclosure. The bonding pad 222a, the conductive pattern 224 and the bonding layer 220 may be formed in multi-layered structure. Referring to FIG. 3A, a conductive portion 222a-1 of the bonding pad 222a and a conductive portion 212-1 of the conductive pattern 224 or the seal ring 212 are formed in a film 220-1 of the bonding layer 220. In some embodiments, the film 220-1 is a patterned layer including recessed portions, and the conductive portion 222a-1 of the bonding pad 222a and the conductive portion 212-1 of the seal ring 212 are formed in the recessed portions of the film 220-1.

Referring to FIG. 3B, a film 220-2 is formed over the film 220-1. In some embodiments, the film 220-2 is a patterned layer exposing portions of the film 220-1. The film 220-2 may expose the top surface of the conductive portions 222a-1 and 212-1. In some embodiments, the fuse structure 230 is formed in the film 220-2 of the bonding layer 220. The fuse structure 230 is formed over the conductive portions 222a-1 and 212-1 and electrically coupled to the conductive portions 222a-1 and 212-1. The fuse structure 230 may electrically connects the conductive portion 222a-1 of the bonding pad 222a to the conductive portion 212-1 of the seal ring 212.

Still referring to FIG. 3B, the fuse structure 230 includes a fuse line 230a, a first conductive segment 230b and a second conductive segment 230c. The fuse line 230a is disposed and extended between the first conductive segment 230b and the second conductive segment 230c. In some embodiments, the first conductive segment 230b and the second conductive segment 230c are respectively referred to as portions of the bonding pad 220a and seal ring 212. In some embodiments, the fuse line 230a is in a shape of straight line or a meandering line. In some embodiments, a width 131 of the fuse line 230a is substantially less than a width D2 of the first conductive segment 230b, in which the width D2 is a line width of the conductive lines 206A or conductive vias 206B. In some embodiments, the width D1 of the fuse line 230a is substantially less than a width D3 of the second conductive segment 230c, in which the width D3 is a line width of the conductive lines 206A or conductive vias 2063. The width D2 may be substantially same as the width D3. Alternatively, the width D2 is different from the width 133. The fuse line 230a, the first conductive segment 230b and the second conductive segment 230c may include conductive material similar as the bonding pad 222a or the conductive pattern 224.

Referring to FIG. 3C, a film 220-3 is formed over the film 220-2. A conductive portion 222a-2 of the bonding pad 222a and a conductive portion 212-2 of the conductive pattern 224 or the seal ring 212 are formed in the film 220-3. The conductive portion 222a-2 is electrically coupled to the first conductive segment 230b of the fuse structure 230. The conductive portion 212-2 is electrically coupled to the second conductive segment 230c of the fuse structure 230. The fuse structure 230 may electrically connects the conductive portion 222a-2 of the bonding pad 222a to the conductive portion 212-2 of the seal ring 212. In some embodiments, the film 220-3 is a patterned layer, and the conductive portions 222a-2 of the bonding pad 222 and the conductive portion 212-2 of the seal ring 212 are formed in the recessed portions of the film 220-3.

It is understood that the schematic drawings of the fuse structure 230 in FIGS. 3A to 3C are for illustration purpose only. The fuse structure 230 may include different structures and layouts according to different applications. Referring to FIG. 3D, a schematic top view of the fuse structure 230 is shown. FIG. 3D is similar to FIG. 3C except that the fuse structure 230 includes a plurality of fuse lines 230d. The fuse lines 230d are disposed and extended between the first conductive segment 230b and the second conductive segment 230c. In some embodiments, the fuse lines 230d are arranged in parallel and separated from each other by a spacing distance D4. In some embodiments, a total width of the fuse lines 230d is substantially less than the width D2 of the first conductive segment 230b or the width D3 of the second conductive segment 230d.

Figure 4:
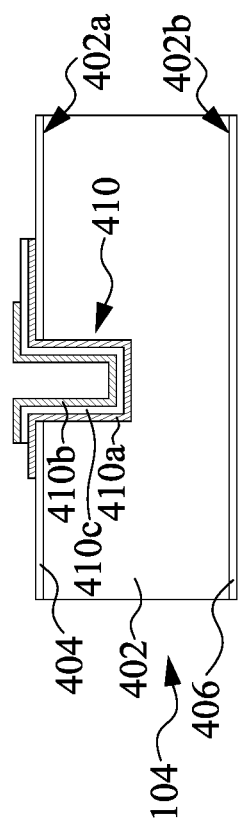
Figure 5:
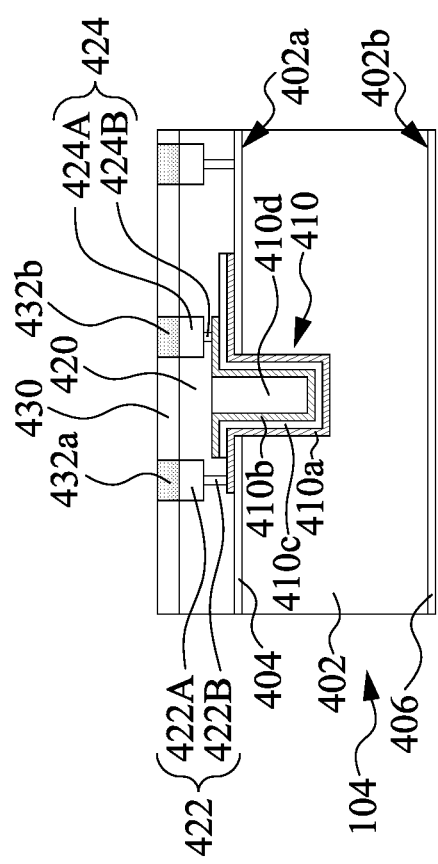

FIGS. 4 and 5 illustrate the formation of a second integrated circuit component 104. Referring to FIG. 4, a substrate 402 is received or provided. The substrate 402 may be a semiconductor substrate, such as a bulk semiconductor or the like, which may be doped (e.g., with a p-type or an n-type dopant) or undoped. In some embodiments, the substrate 402 includes a silicon carbide (SiC) substrate, a sapphire substrate or a silicon substrate. Other suitable substrates may also be used for the substrate 402. The substrate 402 may have a first surface (also referred to as a front surface) 402a and a second surface (also referred to as a back surface) 402b opposite to the first surface 402a.

In some embodiments, one or more buffer layers 404 and 406 are formed on the first surface 402a or the second surface 402b of the substrate 402. In some embodiments, the buffer layer 404 is disposed on the first surface 402a of the substrate 402 and the buffer layer 406 is disposed on the second surface 402b of the substrate 402. In some embodiments, the buffer layers 404 and 406 include a dielectric layer, such as oxide, nitride, oxynitride, or the like.

Still referring to FIG. 4, a first conductive layer 410a, a dielectric layer 410c and a second conductive layer 410b are sequentially deposited over the substrate 402. The first conductive layer 410a and the second conductive layer 410b may be formed of a conductive material, such as copper, silver, aluminum, gold, tungsten, titanium, titanium nitride, tantalum, tantalum nitride or combinations thereof. The dielectric layer 410c may be formed of a dielectric material, such as silicon oxide, silicon nitride, silicon oxynitride, or the like. The first conductive layer 410a, the dielectric layer 410c and the second conductive layer 410b may be formed by initially patterning the substrate 402 to form a trench in the substrate 402 and depositing a conductive material, a dielectric material and another conductive material within the trench and over the substrate. Other patterning operations may be performed to remove excess portions of the first conductive layer 410a, the dielectric layer 410c and the second conductive layer 410b.

In some embodiments, the first conductive layer 410a serves as a first electrode or conductive plate of a first capacitor 410. In some embodiments, the second conductive layer 410b serves as a second electrode or conductive plate of the first capacitor 410. In some embodiments, the dielectric layer 410c serves as an electrical insulating layer between the first conductive layer 410a and the second conductive layer 410b of the first capacitor 410. The first capacitor 410 is disposed on the first surface 402a of the substrate 402. In some embodiments, the first capacitor 410 is exposed from the first surface 402a of the substrate 402.

Referring to FIG. 5, a dielectric layer 410d is deposited over the substrate 402. In some embodiments, the dielectric layer 410d is formed in the first capacitor 410. The dielectric layer 410d may be surrounded by the second conductive layer 410b. The dielectric layer 410d may be formed of a dielectric material similar as the dielectric layer 410c. In some embodiments, the top surface of the dielectric layer 410d is substantially level with the top surface of the first capacitor 410. In some embodiments, the top surface of the dielectric layer 410d is substantially level with the top surface of the second conductive layer 410b.

Still referring to FIG. 5, a redistribution layer 420 is formed over the substrate 402. The redistribution layer 420 is disposed on the first surface 402a of the substrate 402. In some embodiments, the redistribution layer 420 includes conductive patterns 422 and 424. The conductive patterns 422 and 424 may be electrically connected to the first conductive layer 410a and the second conductive layer 410b, respectively. The conductive patterns 422 and 424 may respectively include conductive lines 422A and 424A, and conductive vias 422B and 424B. The conductive line 422A may be electrically connected to the first conductive layer 410a through the conductive via 422B. The conductive line 424A may be electrically connected to the second conductive layer 410h through the conductive via 424B. In some embodiments, the conductive patterns 422 and 424 include conductive materials, such as W, Al, Cu, AlCu, and the like.

In some embodiments, a bonding layer 430 is formed over the first surface 402a of the substrate 402. The bonding layer 430 may be formed of similar materials and by similar processes as those for the bonding layer 220. In some embodiments, the bonding layer 430 includes one or more bonding pads 432a and 432b. The bonding pads 432a and 432b may be formed of similar materials and by similar processes as those for the bonding pads 222a, 222h and 222c. The bonding pad 432a may be electrically connected to the first conductive layer 410a through the conductive pattern 422. The bonding pad 432b may be electrically connected to the second conductive layer 410b through the conductive pattern 424.

In some embodiments, the substrate 402 is singulated by separating the first capacitor 410 from other capacitors along a scribe line. The singulated substrate 402, the first capacitor 410 and the redistribution layer 420 altogether form the second integrated circuit component 104. The bonding layer 430 or the bonding layer 220 may be used as a bonding interface between the second integrated circuit component 104 and first integrated circuit component 102, as discussed below.

Figure 6:
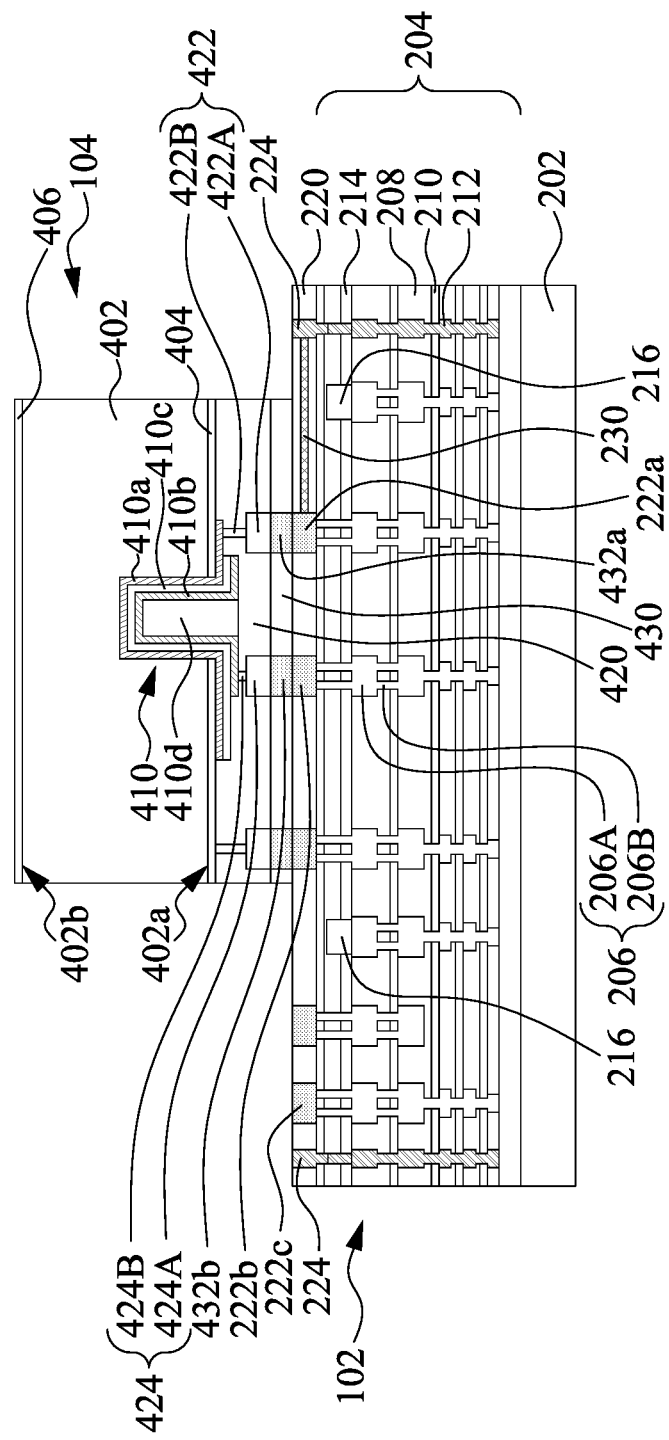

Referring to FIG. 6, the second integrated circuit component 104 is bonded to the first integrated circuit component 102. In some embodiments, the second integrated circuit component 104 is flipped over, picked and placed on the first integrated circuit component 102. The first surface 402a of the second integrated circuit component 104 faces the first integrated circuit component 102. In some embodiments, the bonding between the first integrated circuit component 102 and the second integrated circuit component 104 is performed at a die-to-wafer level. Alternatively, the bonding between the first integrated circuit component 102 and the second integrated circuit component 104 may be performed at the die-to-die level or wafer-to-wafer level. In some embodiments, the bonding pads 432a and 432b of the second integrated circuit component 104 are aligned with the bonding pads 222a and 222b, respectively, of the first integrated circuit component 102. After the alignment process, the bonding pads 432a and 432b of bonding layer 430 and the bonding pads 222a and 222b of bonding layer 220 are bonded together by, for example, applying pressure, radiation, heat or the like. Afterwards, the dielectric materials of the bonding layer 430 and the dielectric materials of the bonding layer 220 are bonded with a dielectric-to-dielectric bond, while the bonding pads 432a and 432b of bonding layer 430 and the bonding pads 222a and 222b of bonding layer 220 are bonded with a metal-to-metal bond. In some embodiments, the bonding between the bonding layers 430 and 220 includes hybrid bonding, pressure bonding or fusion bonding.

Figure 7:
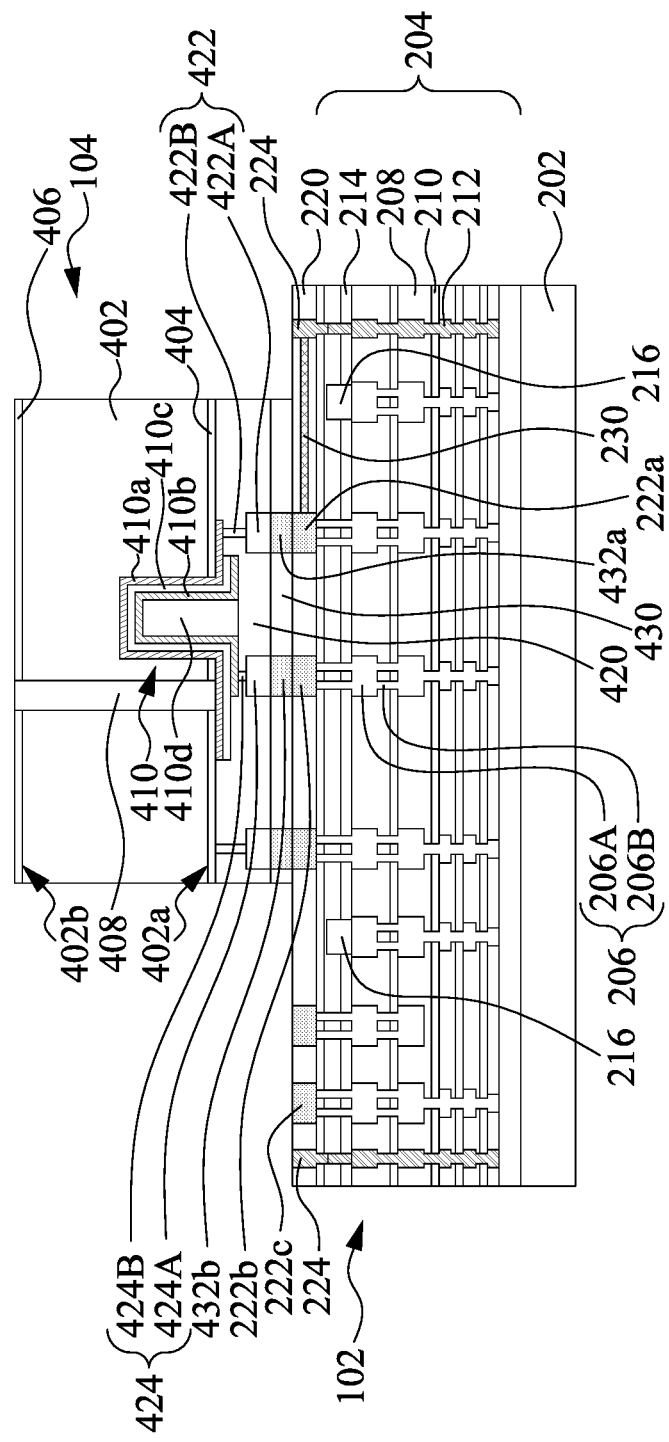

Referring to FIG. 7, a through via 408 is formed in the substrate 402. The through via 408 may be formed by an etching operation on the substrate 402 followed by a deposition process. The through via 408 may include conductive materials, such as W, Al, Cu, AlCu, and the like. In some embodiments, the through via 408 is referred to as a through silicon via. The through via 408 may be electrically connected to the first capacitor 410. In some embodiments, the through via 408 is electrically connected to the first conductive layer 410a of the first capacitor 410.

Figure 8:
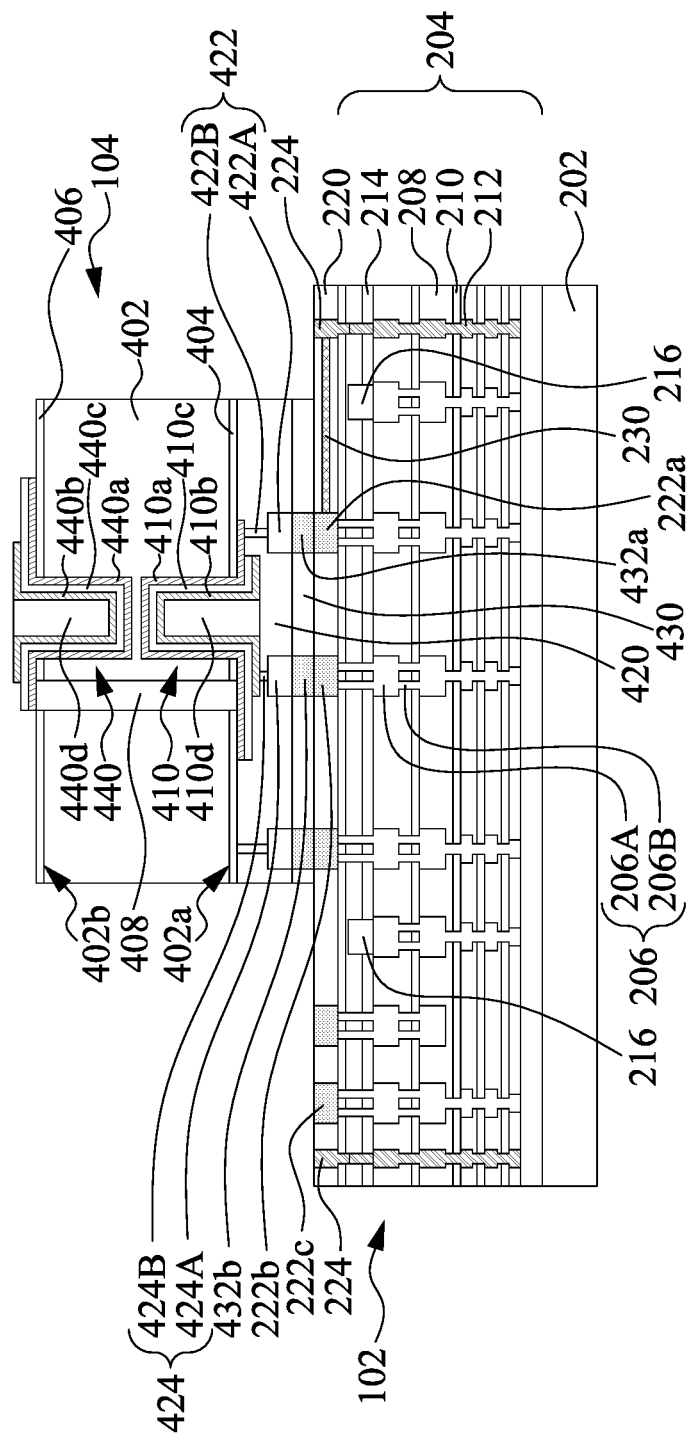

Referring to FIG. 8, a second capacitor 440 is formed in the substrate 402. The second capacitor 440 may include a first conductive layer 440a, a second conductive layer 440b and a dielectric layer 440c. The second capacitor 440 may be formed of similar materials and by similar processes as those for the first capacitor 410. In some embodiments, the first conductive layer 440a serves as a first electrode or conductive plate of the second capacitor 440. In some embodiments, the second conductive layer 440b serves as a second electrode or conductive plate of the second capacitor 440. In some embodiments, the dielectric layer 440c serves as an electrical insulating layer between the first conductive layer 440a and the second conductive layer 440b of the second capacitor 440. The second capacitor 440 is disposed on the second surface 402b of the substrate 402. In some embodiments, the second capacitor 440 is exposed from the second surface 402b of the substrate 402. In some embodiments, the second capacitor 440 is electrically connected to the first capacitor 410. In some embodiments, the second capacitor 440 is electrically connected to the first capacitor 410 through the through via 408. In some embodiments, the first conductive layer 440a of the second capacitor 440 is electrically connected to the first conductive layer 410a of the first capacitor 410 through the through via 408. In some embodiments, the second capacitor 440 is electrically floating if the though via 408 is absent. In the present example, only two capacitors are shown in the substrate 402; however, the number of capacitors and the arrangement of the capacitors can be altered according to various applications. In some embodiments, the second integrated circuit component 104 is a capacitor die. In some embodiments, the second integrated circuit component 104 is referred to as a deep trench capacitor (DTC) die, which includes at least one deep trench capacitor.

In some embodiments, a dielectric layer 440d is formed in the second capacitor 440. The dielectric layer 440d may be surrounded by the second conductive layer 440b. In some embodiments, the top surface of the dielectric layer 440d is substantially level with the top surface of the second capacitor 440. In some embodiments, the top surface of the dielectric layer 440d is substantially level with the top surface of the second conductive layer 440h.

Figure 9:
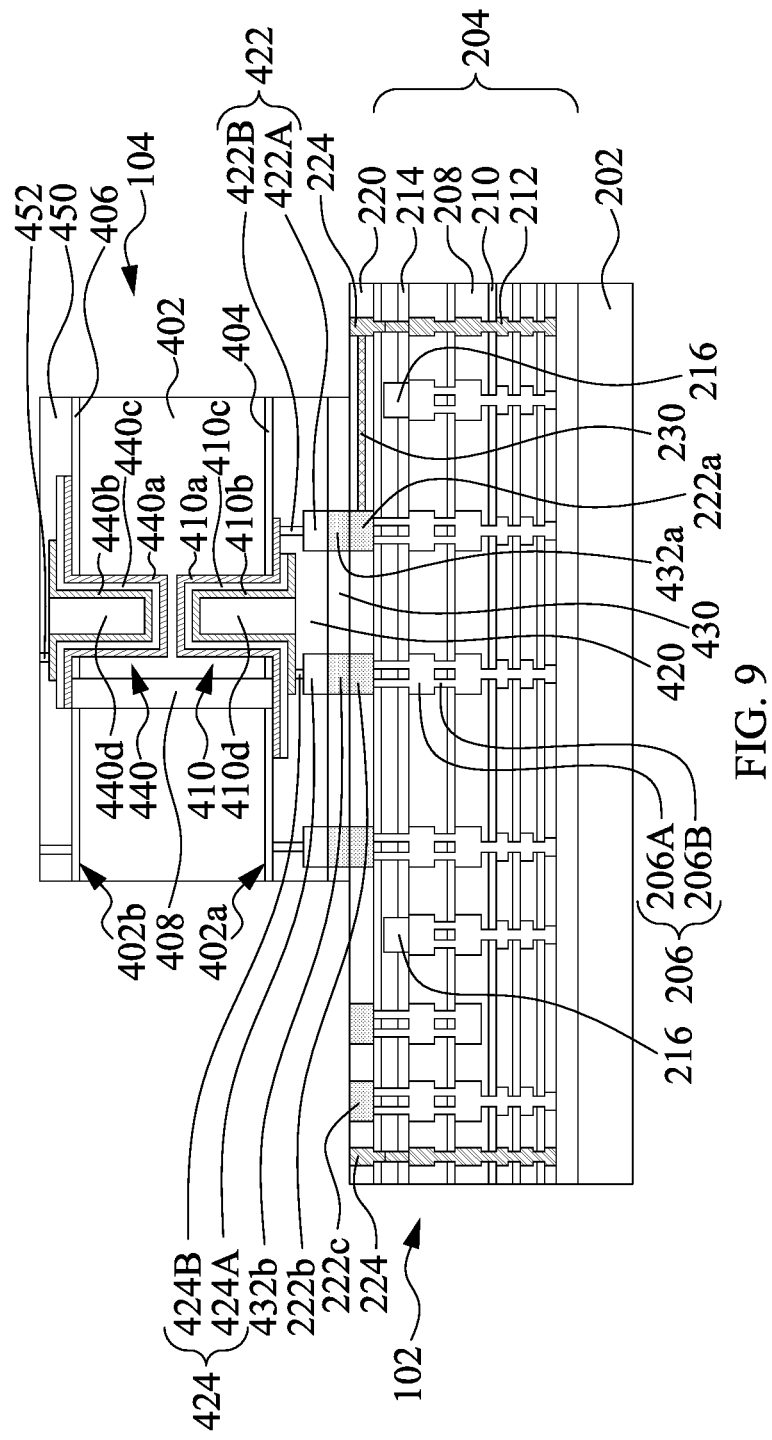

Referring to FIG. 9, a redistribution layer 450 is formed over the substrate 402. The redistribution layer 450 is disposed on the second surface 402b of the substrate 402. In some embodiments, the redistribution layer 450 includes conductive patterns 452. The conductive patterns 452 may be electrically connected to the first conductive layer 440a or the second conductive layer 440b. The conductive patterns 452 may include conductive vias or conductive lines (not shown). The conductive patterns 452 can include conductive materials similar as the conductive patterns 422 and 424.

Figure 10:
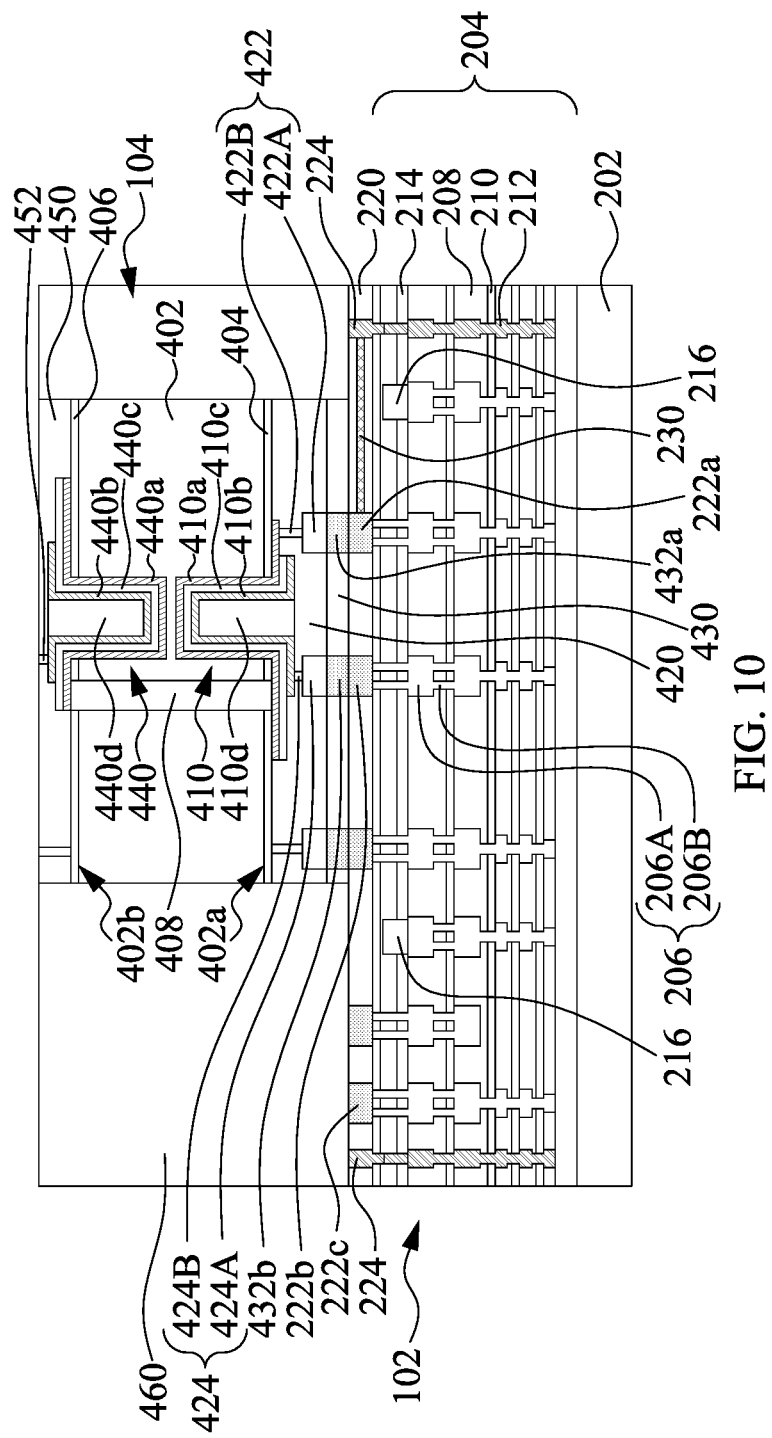

Referring to FIG. 10, a dielectric layer 460 is formed over the first integrated circuit component 102. The second integrated circuit component 104 may be encapsulated by the dielectric layer 460. The dielectric layer 460 may further cover the exposed portions of the first integrated circuit component 102. In some embodiments, the dielectric layer 460 includes a dielectric material selected from encapsulating or molding materials. In some embodiments, the dielectric layer 460 includes, for example, compliant epoxies that are liquid at temperatures above room temperature, and have rapid cure times especially at elevated temperatures and low viscosity during dispensing.

Figure 11:
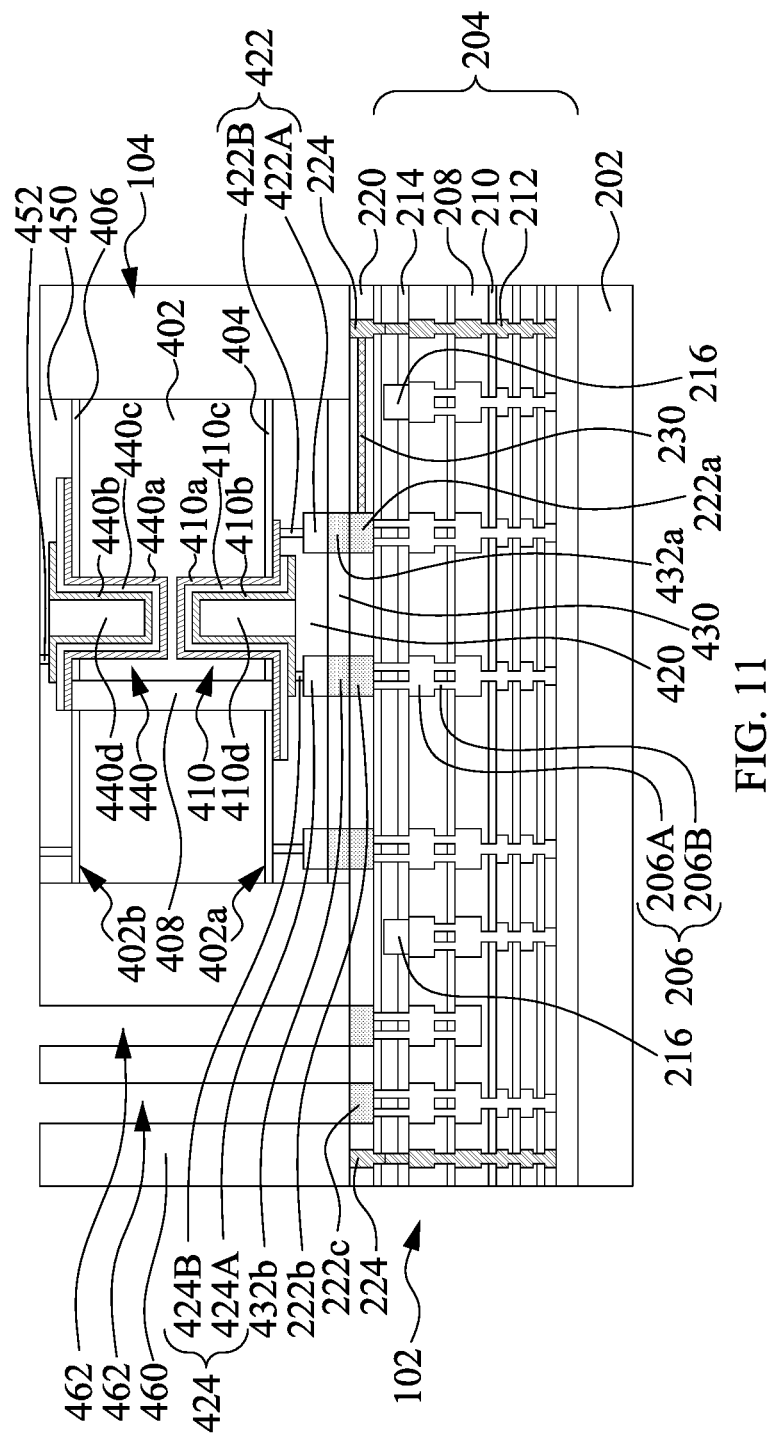

Referring to FIG. 11, an etching operation may be performed to form one or more trenches 462 in the dielectric layer 460. The etching operation may include a dry etch, a wet etch or a combination thereof. In some embodiments, one or more plasma treatments are involved in the etching operation. In some embodiments, charges or electrons will accumulate in the first capacitor 410 or the second capacitor 440 of the second integrated circuit component 104. For example, the charges induced by the plasma treatment may accumulate in the first conductive layer 410a or the second conductive layer 410b of the first capacitor 410. The accumulated charges may damage the electrically floating features of the semiconductor structure 100 or the underlying features in the first integrated circuit component 102.

Through the proposed scheme, the charges accumulated in the first conductive layer 410a of the first capacitor 410 may flow to the electrical ground through one or more discharge paths. For example, the charges in the first conductive layer 410a of the first capacitor 410 may flow to the electrical ground through the conductive pattern 422, the bonding pad 432a, the bonding pad 222a and the conductive patterns 206 in the dielectric layers 208 and the seal ring 212. Alternatively, the charges in the first conductive layer 410a of the first capacitor 410 may flow to the electrical ground through the conductive pattern 422, the bonding pad 432a, the bonding pad 222a and the seal ring 212. The charges in the second conductive layer 410b of the first capacitor 410 may flow to the electrical ground through the conductive pattern 424, the bonding pad 432b, the bonding pad 222b and the conductive pattern 206. The presence of the fuse structure 230 provides a discharge path between the first capacitor 410 and the electrical ground. Thus, the charge accumulation problem of the first capacitor 410 may be mitigated.

In some embodiments, the charges induced by the plasma treatment also accumulate in the first conductive layer 440a or the second conductive layer 440b of the second capacitor 440. The charges in the first conductive layer 440a of the second capacitor 440 may flow to the electrical ground through the through via 408, the conductive pattern 422, the bonding pad 432a, the bonding pad 222a and the seal ring 212. In some embodiments, the second capacitor 440 is electrically floating if the though via 408 is not present. The through via 408 provides a discharge path between the second capacitor 440 and the electrical ground. Thus, the charge accumulation problem of the second capacitor 440 may be addressed. The charges may still accumulate in the second conductive layer 440b of the second capacitor 440 since the second conductive layer 440b is electrically floating. However, the presence of the through via 408 prevents the second capacitor 440 from charge-induced damage since at least one of the conductive layers of the second capacitor 440 is grounded. Accordingly, the charge accumulation problem of the second capacitor 440 or the first capacitor 410 of the second integrated circuit component 104 may be mitigated.

Figure 12:
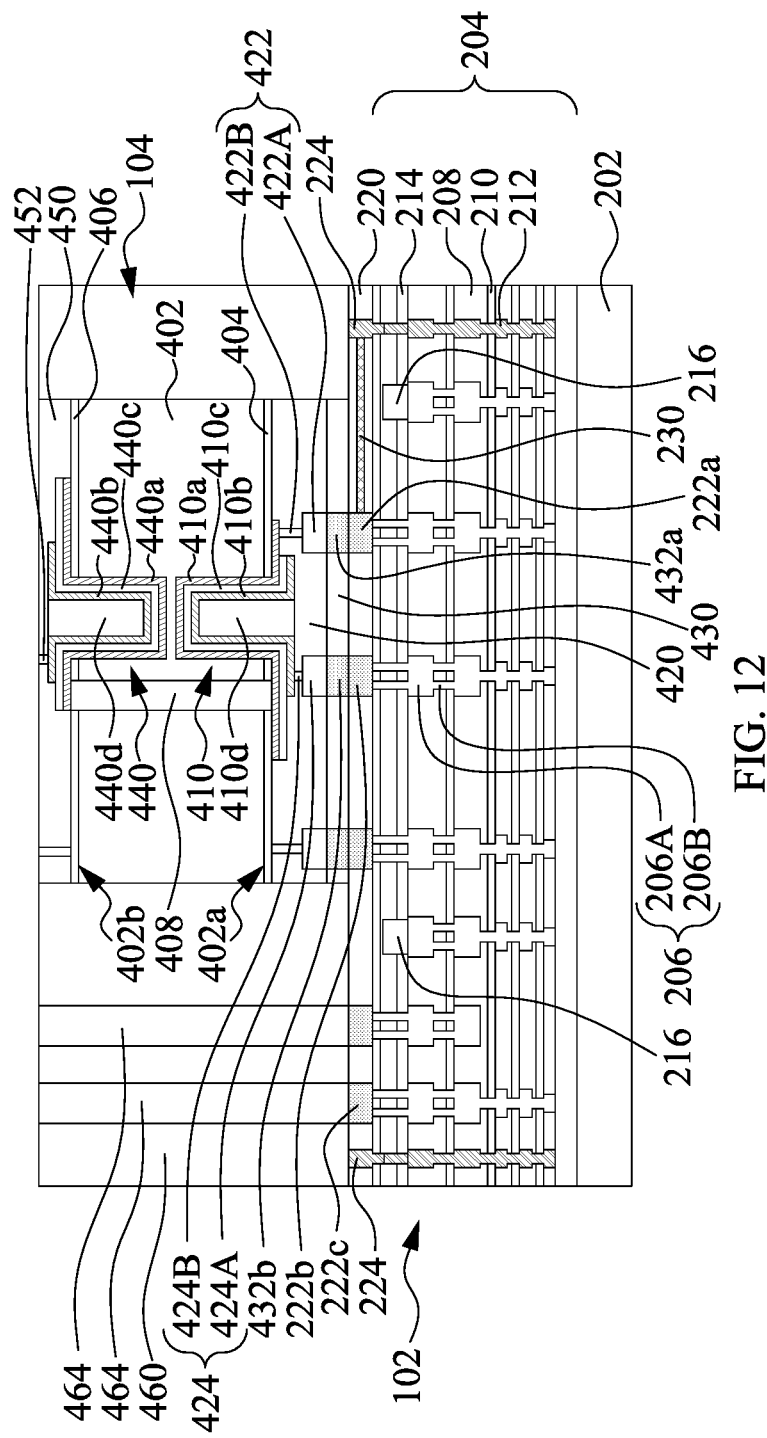

Referring to FIG. 12, one or more through vias 464 are formed in the trenches 462 of the dielectric layer 460. The through via 464 may include conductive materials, such as W, Al, Cu, AlCu, and the like. In some embodiments, the through vias 464 are referred to as through dielectric vias. In some embodiments, one of the through vias 464 is electrically connected to the bonding pad 222c of the bonding layer 220.

Figure 13:
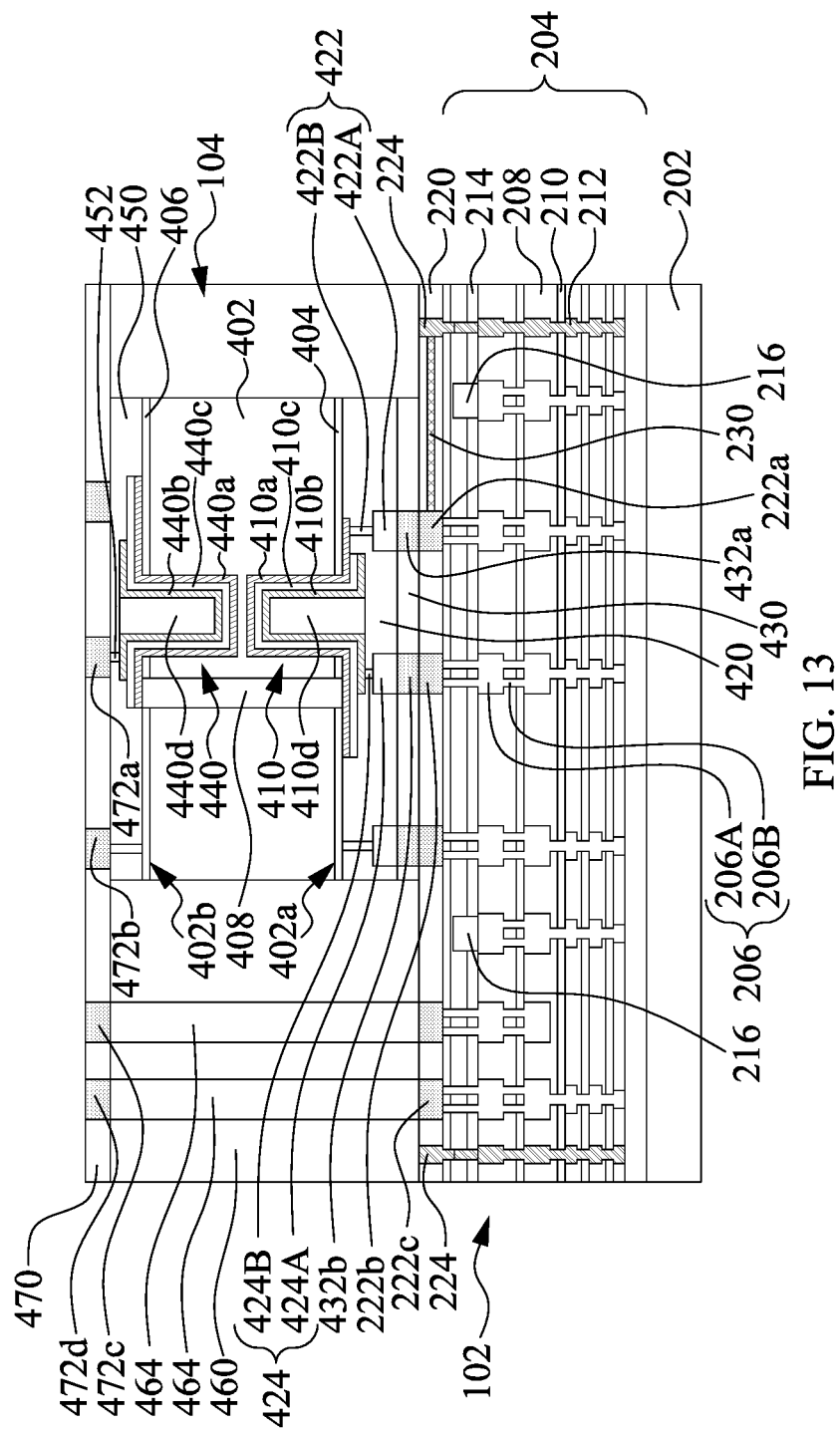

Referring to FIG. 13, a bonding layer 470 is formed over the second integrated circuit component 104 and the dielectric layer 460. The bonding layer 470 may be formed of similar materials and by similar processes as those for the bonding layer 430. In some embodiments, the bonding layer 470 includes one or more bonding pads 472a, 472b, 472c and 472d. The bonding pads 472a, 472b, 472c and 472d may be formed of similar materials as the bonding pads 432a and 432b. The bonding pad 472a may be electrically connected to the second conductive layer 440b through the conductive patterns 452. The bonding pad 472d may be electrically connected to the bonding pad 222c through the through via 464.

In some embodiments, the formation of the bonding layer 470 and the bonding pads 472a, 472b, 472c and 472d involves one or more treatments, such as a plasma treatment or a spin coating treatment. The charges induced by the plasma treatment or the spin coating treatment may accumulate in the first capacitor 410 or the second capacitor 440 of the second integrated circuit component 104 as discussed above. With the presence of the through via 408 and the fuse structure 230, the charges accumulated in the first capacitor 410 or the second capacitor 440 may dissipate to the electrical ground. Accordingly, the charge accumulation problem of the first capacitor 410 or the second capacitor 440 of the second integrated circuit component 104 may be mitigated.

Figure 14:
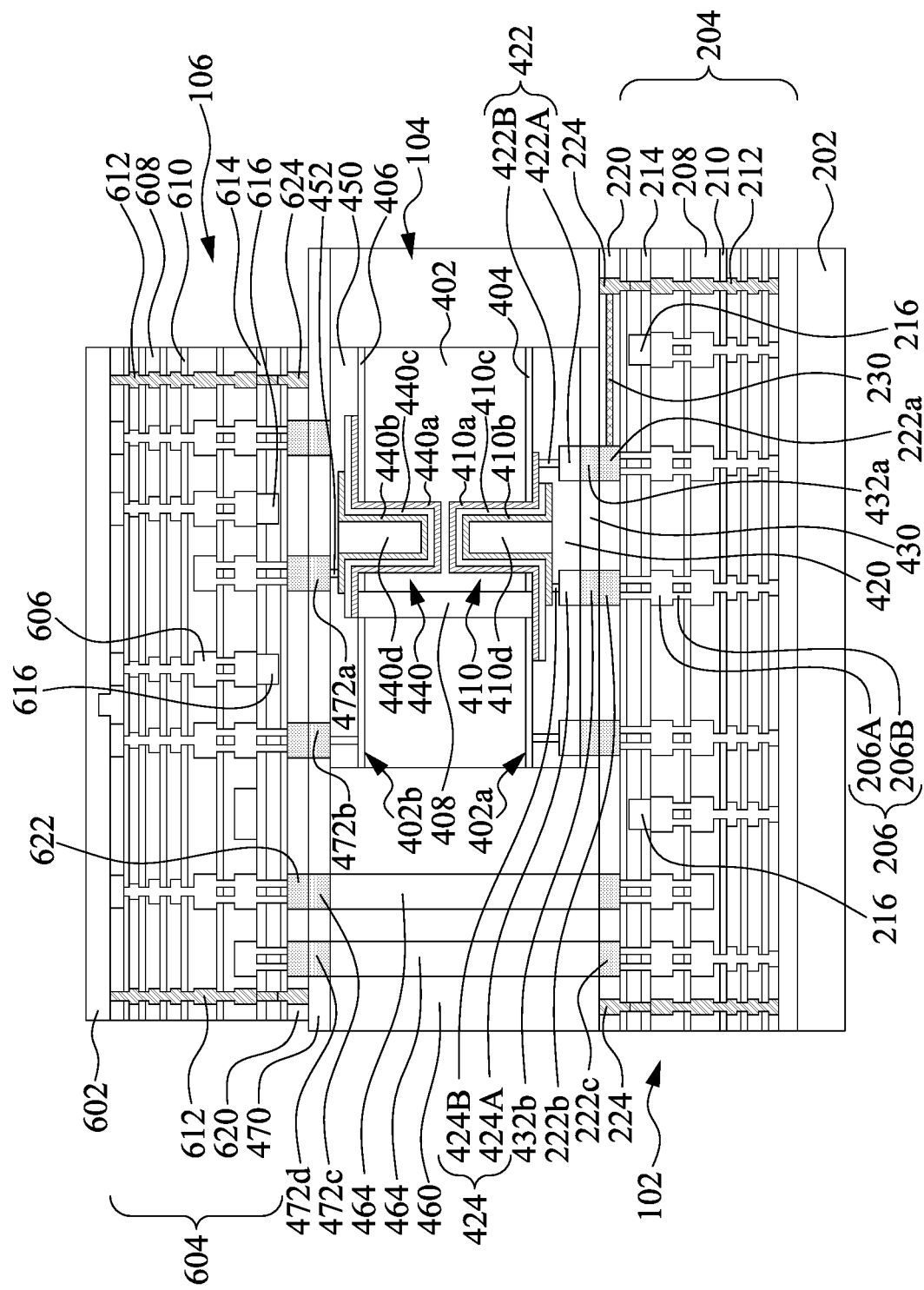

Referring to FIG. 14, a third integrated circuit component 106 may be received or provided. The third integrated circuit component 106 may be referred to as a semiconductor die. In some embodiments, the third integrated circuit component 106 is an individual die after singulation. In some embodiments, the third integrated circuit component 106 is a wafer before singulation. The third integrated circuit component 106 may include similar features as the first integrated circuit component 102. To simplify the description, the similar features are labelled with similar numerals.

The third integrated circuit component 106 may include a substrate 602 and an interconnection structure 604 on the substrate 602. The interconnection structure 604 may include one or more dielectric layers 608, wherein each dielectric layer 608 include one or more conductive patterns 606. In some embodiments, the interconnection structure 604 further includes one or more etch stop layers 610 and one or more seal rings 612. In some embodiments, the interconnection structure 604 further includes a passivation layer 614 and one or more test pads 616. In some embodiments, the third integrated circuit component 106 further includes a bonding layer 620 disposed over the interconnection structure 604. The bonding layer 620 may include one or more bonding pads 622.

Still referring to FIG. 14, the third integrated circuit component 106 may be picked and placed on the second integrated circuit component 104. In some embodiments, a bonding between the third integrated circuit component 106 and the second integrated circuit component 104 are performed at a die-to-die level. Alternatively, the bonding between the third integrated circuit component 106 and the second integrated circuit component 104 may be performed at a die-to-wafer level or wafer-to-wafer level. In some embodiments, the bonding pads 622 of the third integrated circuit component 106 are aligned with the corresponding bonding pads 472a, 472b, 472c and 472d of the second integrated circuit component 104. After the alignment process, the bonding pads 622 of bonding layer 620 and the bonding pads 472a, 472b, 472c and 472d of bonding layer 470 are bonded together by, for example, applying pressure, radiation, heat or the like. In some embodiments, the bonding between the bonding layers 620 and 470 includes hybrid bonding, pressure bonding or fusion bonding.

After the bonding process, the third integrated circuit component 106 may be electrically connected to the first integrated circuit component 102. The third integrated circuit component 106 may be electrically connected to the first integrated circuit component 102 through the bonding pads 622, 472d, the through via 464 and the bonding pad 222c. In some alternative embodiments, the first integrated circuit component 102 may further include an additional fuse structure (not shown) between the bonding pad 222c and the seal ring 212. The additional fuse structure may electrically connect the third integrated circuit component 106 to the electrical ground through the bonding pads 622, 472d, the through via 464, the bonding pad 222c, the additional fuse structure and the seal ring 212. In some embodiments, the fuse structure 230 is kept shorted or is not blown yet during the processing of the first integrated circuit component 102, the second integrated circuit component 104 and the third integrated circuit component 106. In some embodiments, the fuse structure 230 is blown after the processing of the third integrated circuit component 106. In some embodiments, the third integrated circuit component 106 is electrically floating if the though via 464 is not present.

Figure 15:
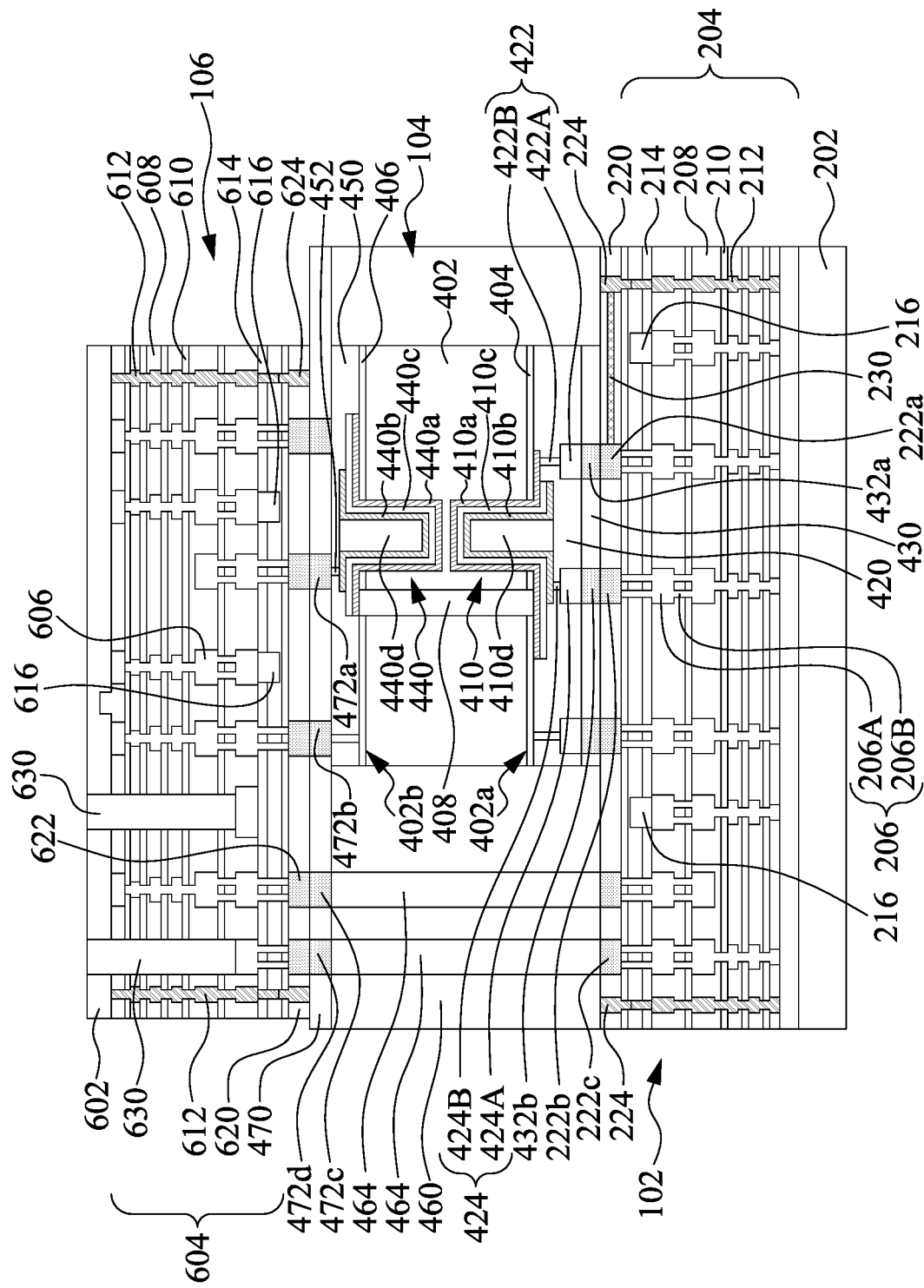

Referring to FIG. 15, one or more through vias 630 are formed in the third integrated circuit component 106. In some embodiments, the through vias 630 are extended through the substrate 602 and the interconnection structure 604. In some embodiments, prior to the formation of the through vias 630, a thinning process is performed to thin down the substrate 602. After the thinning process, several treatments, such as an etching process to form trenches in the substrate 602 and the interconnection structure 604 and a deposition process to deposit conductive materials in the trenches, may be performed to form the through vias 630. As discussed previously, the treatments may induce charge accumulation in the first capacitor 410 or the second capacitor 440 of the second integrated circuit component 104. With the discharge path formed by the through via 408 and the fuse structure 230, the charges accumulated in the first capacitor 410 or the second capacitor 440 may flow to the electrical ground. Thus, the charge-induced damages can be mitigated.

Figure 16:
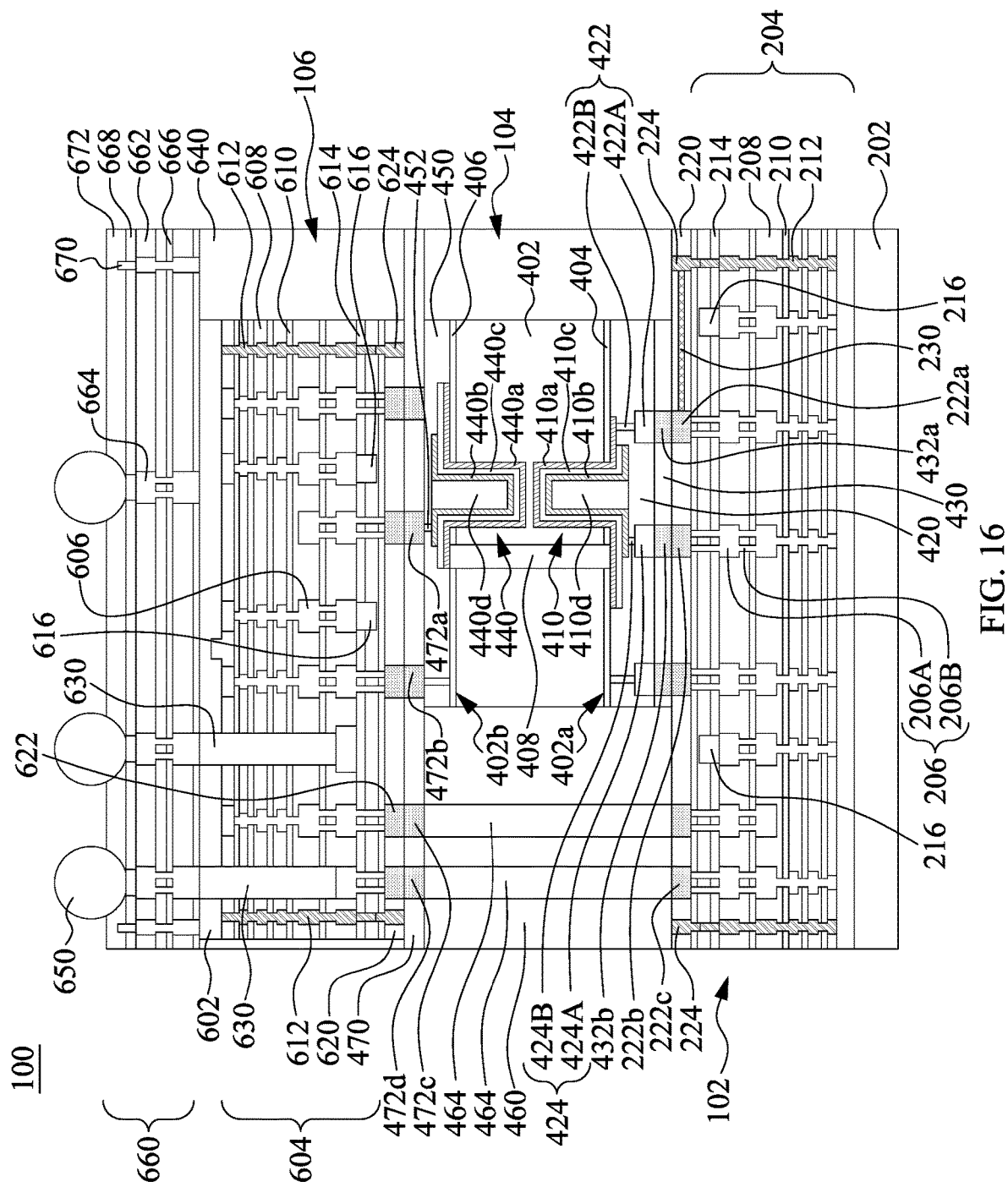

Referring to FIG. 16, a dielectric layer 640 is formed to surround the third integrated circuit component 106. The third integrated circuit component 106 may be encapsulated by the dielectric layer 640. In some embodiments, an interconnection structure 660 including one or more dielectric layers 662 and respective conductive patterns 664 is formed over the back surface of the third integrated circuit component 106. The conductive patterns 664 embedded in the dielectric layers 662 may be in electrical and physical contact with the through vias 630 of the third integrated circuit component 106. In some embodiments, one or more input/output (110) terminals 650 are formed over the third integrated circuit component 106. In some embodiments, under-ball metallurgy (UBM) (not shown) are formed prior to the forming of the I/O terminals 650. In some embodiments, the interconnection structure 660 further includes one or more etch stop layers 666, one or more passivation layers 668 and one or more conductive pads 670 and one or more buffer layers 672.

In some embodiments, after the interconnection structure 660 is formed, the stack of the first integrated circuit component 102, the second integrated circuit component 104 and the third integrated circuit component 106 undergoes a singulation process to form the semiconductor structure 100. In some embodiments, the stack of the first integrated circuit component 102, the second integrated circuit component 104 and the third integrated circuit component 106 is singulated by sawing along a scribe line.

As discussed previously, the method for forming the semiconductor structure 100 may include performing one or more charge-induced treatments, such as a plasma treatment, a spin coating treatment or the like. In some embodiments, a charge-induced treatment is involved in forming the interconnection structure 660. In some embodiments, charges or electrons accumulate in the electrically floating structures, such as the second capacitor 440 of the second integrated circuit component 104, if the fuse structure 230 or the through via 408 is not present. The fuse structure 230 arranged in the semiconductor structure 100 establishes a discharge path between the electrically floating structure and the electrical ground. Thus, charges or electrons formed in the charge-induced treatments and accumulated in the electrically floating structure may, flow to the electrical ground. Accordingly, the charge accumulation problems in the semiconductor structure 100 may be mitigated.

In some embodiments, the fuse structure 230 is kept shorted or is not blown yet during the processing of the first integrated circuit component 102, the second integrated circuit component 104 and the third integrated circuit component 106. In some embodiments, the fuse structure 230 is blown after a charge-induced treatment. In some embodiments, the fuse structure 230 is blown before forming the input/output WO) terminals 650 or before the completion of the semiconductor structure 100. In some embodiments, a void is formed in the bonding layer 220 after the fuse structure 230 is blown. In some embodiments, the fuse structure 230 is blown by a laser treatment. In some embodiments, the fuse structure 230 is blown by a blowing current provided through a control circuit. For example, the fuse structure 230 may be initially connected with logic circuits. Then, in a final processing step, the semiconductor structure 100 is subjected to a command through the logic circuits to cause a current to flow by and blow the fuse structure 230. The fuse structure 230 may be designed with a less line width than a normal line width of the conductive patterns 206/224, the bonding pads 222a, 222b or configured to sustain less electrical voltage/current, such that the fuse structure 230 can be successfully blown without adversely damaging the conductive patterns 206/224, the bonding pads 222a and 222b.

It is understood that the schematic drawings of the fuse structure 230 in FIGS. 1 to 16 are for illustration purpose only. The fuse structure 230 may include different structures and layouts according to different applications. It is also understood that the schematic drawings of the fuse structure 230 in FIGS. 1 to 16 illustrates processing stages before the fuse structure 230 is blown.

FIGS. 17A through 17B are schematic top views showing different statuses of the fuse structure 230 before and after blowing, respectively, in accordance with some embodiments of the present disclosure. Many aspects of the fuse structure 230 are similar to those of the fuse structure 230 illustrated in FIG. 3C, and are hereby omitted from discussion for brevity.

Referring to FIG. 17A, the fuse structure 230 include the fuse line 230a, the first conductive segment 230b and the second conductive segment 230c. The first conductive segment 230b and the second conductive segment 230c enable the fuse line 230a to be electrically connected to one or more elements adjacent to the fuse structure 230. The one or more elements connected to the fuse structure 230 may include the first capacitor 410 and the second capacitor 440 of the second integrated circuit component 104.

The one or more elements are made disconnected to the fuse structure 230 by blowing the fuse structure 230. In some embodiments, a section 231 of the fuse line 230a is blown to create an opening 233 in the fuse line 230a as shown in FIG. 17B. The opening 233 is defined by a void 226 in the bonding layer 220 where the section 231 of the fuse line 230a is disposed. The void 226 is between opposing end portions 230a-1 and 230a-2 of the fuse line 230a. The portions 230a-1 and 230a-2 are separated by the void 226. In some embodiments, the portion 230a-1 is electrically connected to the seal ring 212 and the portion 230a-2 is electrically connected to the first capacitor 410 or the second capacitor 440 of the second integrated circuit component 104 after the fuse structure 230 is blown.

In some embodiments, the density of the fuse structure 230 shows a nonuniform distribution through the blowing operation. For example, the density of the fuse line 230a is reduced after the fuse structure 230 is blown. A density of the fuse line 230a is made less than a density of the portion 230a-1 or 230a-2. The density of the portion 230a-1 or 230a-2 may be varied from the edge close to the void 226 to an edge of the portion 230a-1 or 230a-2 distal to the void 226. In some embodiments, a density of the portion 230a-1 or 230a-2 closer to the void 226 is greater than a density of the portion 230a-1 or 230a-2 closer to the first conductive segment 230b or the second conductive segment 230c.

In some embodiments, the density of the bonding layer 220 shows an nonuniform distribution after the fuse structure 230 is blown. For example, the density of the bonding layer 220 may be consistent along the section 231 before the fuse structure 230 is blown. After the fuse structure 230 is blown, the density of the bonding layer 220 is varied from the edge close to the void 226 to an edge of the bonding layer 220 distal to the void 226. In some embodiments, a density of the bonding layer 220 closer to the void 226 is greater than a density of the bonding layer 220 closer to the first conductive segment 230b or the second conductive segment 230c.

In some embodiments, the void 226 is surrounded by a metal oxide. In some embodiments, during the blowing of the fuse structure 230, the metal in the fuse line 230a becomes molten. In some embodiments, during the blowing of the fuse structure 230, the oxide in the bonding layer 220 surrounding the fuse line 230a is melted. In some embodiments, the molten metal migrates to the surrounding melted oxide and forms the metal oxide. In some embodiments, a size of the void 226 is about 0.1 micron.

In some embodiments, a length L1 of the portion 230a-1 is different from a length L2 of the portion 230a-2. In some embodiments, the length L1 of the portion 230a-1 and the length L2 of the portion 230a-2 are substantially the same.

In some embodiments, a sidewall S1 of the portion 230a-1 and a sidewall S2 of the portion 230a-2 are straight or curved. In some embodiments, the shape of the void 226 is rectangle, circle, polygon, or irregular.

In some embodiments, the fuse structure 230 is blown by a laser treatment. For example, the section 231 of the fuse line 230a is vaporized with a high energy laser beam 239 to blow the fuse line 230a, thereby forming the opening 233. In some embodiments, the fuse line 230a is arranged vertically spaced apart from the second integrated circuit component 104 from a top-view perspective. In some embodiments, the fuse line 230a is arranged vertically spaced apart from the third integrated circuit component 106 from a top-view perspective. In some embodiments, the bonding layer 220 that includes the fuse line 230a is arranged on a topmost layer of the first integrated circuit component 102 for receiving the laser beam during a blowing operation. In some embodiments, the bonding layer 220, the dielectric layer 460, and the dielectric layer 640 include oxide, nitride or other suitable dielectric materials. In some embodiments, the materials of the bonding layer 220, the dielectric layer 460, and the dielectric layer 640 are selected from materials being transparent to the laser beams. Thus, the bonding layer 220 or the other layers over the fuse structure 230 may not block or influence the laser beams.

In some embodiments, the fuse structure 230 is blown by an electrical current through control of a control circuit. For example, the section 231 of the fuse line 230a is vaporized with a current to create the opening 233 in the fuse line 230a. In some embodiments, the conductive patterns 206 and the seal ring 212 are arranged under the first conductive segment 230b or the second conductive segment 230c as illustrated in FIG. 16. The first conductive segment 230b may be electrically connected to the conductive patterns 206 in lower metal levels. The first conductive segment 230b may be electrically connected to an associated control circuit (not shown) formed in an underlying circuit area of the substrate 202 and electrically connected to the conductive patterns 206. The control circuit in the substrate 202 may control the current flow. In some embodiments, the section 231 of the fuse line 230a is blown after conducting a current to pass through the fuse line 230a.

The fuse structure 230 of the present disclosure is not limited to the above-mentioned embodiments, and may have other different embodiments. FIGS. 1.8A through 18B are schematic top views showing different statuses of the fuse structure 230 before and after blowing, respectively, in accordance with some embodiments of the present disclosure. Many aspects of the fuse structure 230 are similar to those of the fuse structure 230 illustrated in FIG. 3D and are hereby omitted from discussion for brevity.

Referring to FIG. 18A, the fuse structure 230 includes the fuse lines 230d, the first conductive segment 230b and the second conductive segment 230c. Referring to FIG. 1.8B, the fuse structure 230 may be blown by vaporizing a section 235 of the fuse lines 230d with a high energy laser beam 239 or a current to create an opening 237 in the fuse lines 230d, as shown in FIG. 18B. Referring to FIG. 18B, the opening 237 is defined by voids 228 in the bonding layer 220 where the section 235 of the fuse lines 230d is disposed. The voids 228 are formed between opposing end portions 230d-1 and 230d-2 of the fuse lines 230d. The portions 230d-1 and 230d-2 are separated by the voids 228. In some embodiments, a length L3 of the portion 230d-1 is different from a length IA of the portion 230d-2. In some embodiments, the length L3 of the portion 230d-1 and the length L4 of the portion 230d-2 are substantially the same. In some embodiments, the lengths of the blown fuse lines 230d in portion 230d-1 or 230d-2 are different. In some embodiments, the shape of the void 228 is rectangle, circle, polygon, or irregular.

The structures of the present disclosure are not limited to the above-mentioned embodiments, and may have other different embodiments. To simplify the description and for the convenience of comparison between each of the embodiments of the present disclosure, components in each of the following embodiments that are discussed previously are labelled with identical numerals. For convenience of comparing the difference between the embodiments, the following description will detail the dissimilarities among different embodiments and the identical features will not be repeated.

Figure 19:
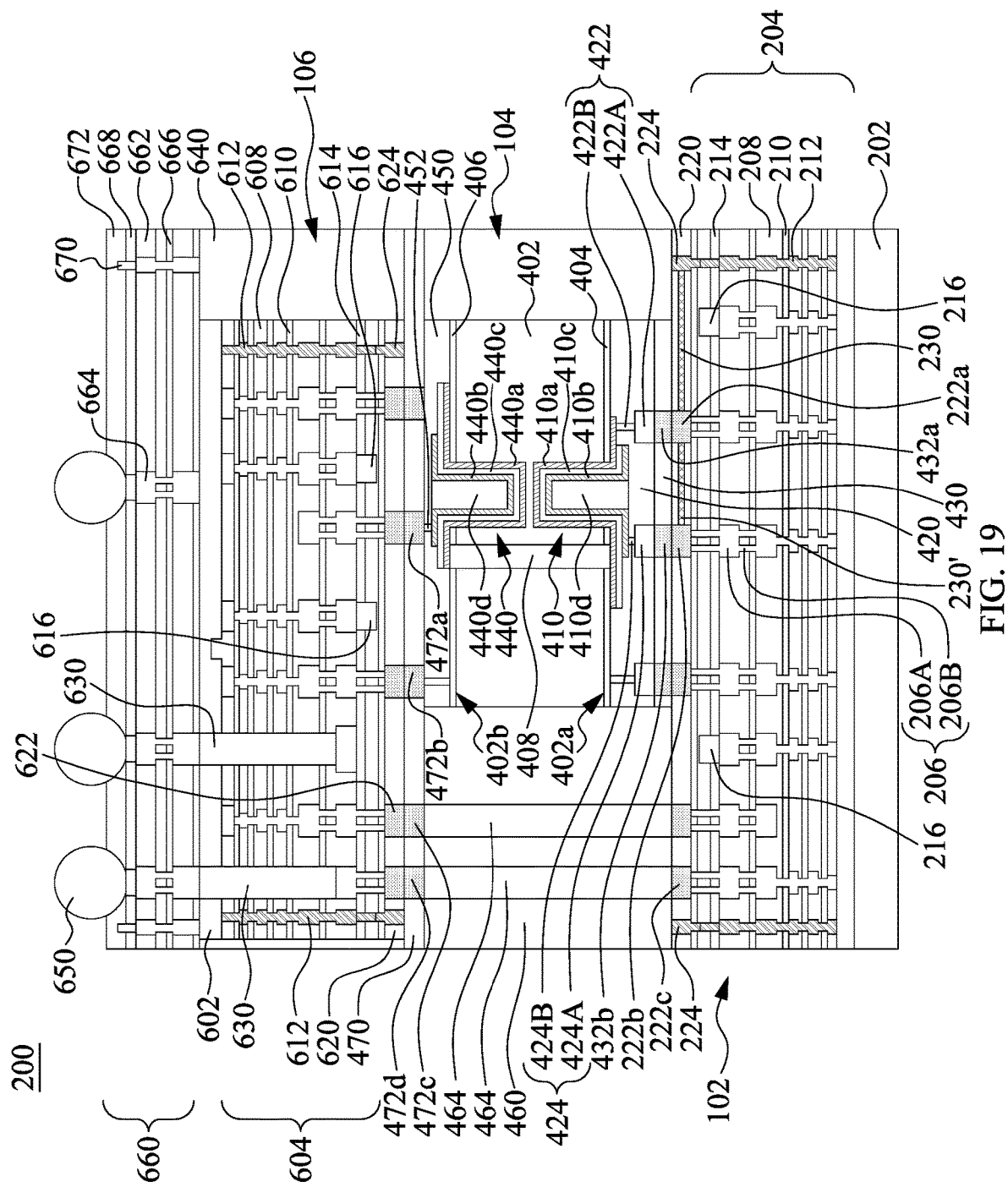
FIG. 19 is a schematic cross-sectional view of a semiconductor structure, in accordance with some embodiments of the present disclosure.

FIG. 19 is a schematic cross-sectional view of a semiconductor structure 200, in accordance with some embodiments of the present disclosure. The semiconductor structure 200 shown in FIG. 19 is similar to the semiconductor structure 100 shown in FIG. 16 except that the semiconductor structure 200 further includes an additional fuse structure 230'. In some embodiments, the fuse structure 230' is disposed in the bonding layer 220. The fuse structure 230' may be electrically connected to the seal ring 212 through the bonding pad 222a and the fuse structure 230. The fuse structure 230' may be formed of similar materials and by similar processes as those for the fuse structure 230. The fuse structure 230' may be electrically connected to the electrical ground through the seal ring 212. In some embodiments, the fuse structures 230 and 230' are kept shorted or are not blown yet during the processing of the first integrated circuit component 102, the second integrated circuit component 104 and the third integrated circuit component 106. In some embodiments, the fuse structures 230 and 230' are blown after the processing of the first integrated circuit component 102, the second integrated circuit component 104 and the third integrated circuit component 106. In some embodiments, the fuse structure 230' is disposed at a level different from that of the fuse structure 230. In some embodiments, the fuse structure 230' is formed in the interconnection structure 204.

The fuse structures 230 and 230' may be electrically connected to different conductive layers of the first capacitor 410. For example, the first conductive layer 410a of the first capacitor 410 is electrically connected to the fuse structure 230 through the conductive pattern 422, the bonding pad 432a and the bonding pad 222a. The second conductive layer 410b of the first capacitor 410 is electrically connected to the fuse structure 230' through the conductive pattern 424, the bonding pad 432b and the bonding pad 222b. With the additional discharge path formed by the fuse structure 230', the charges accumulated in the second conductive layer 410b of the first capacitor 410 may flow to the electrical ground more efficiently. Thus, the charge-induced damages can be mitigated.

Figure 20:
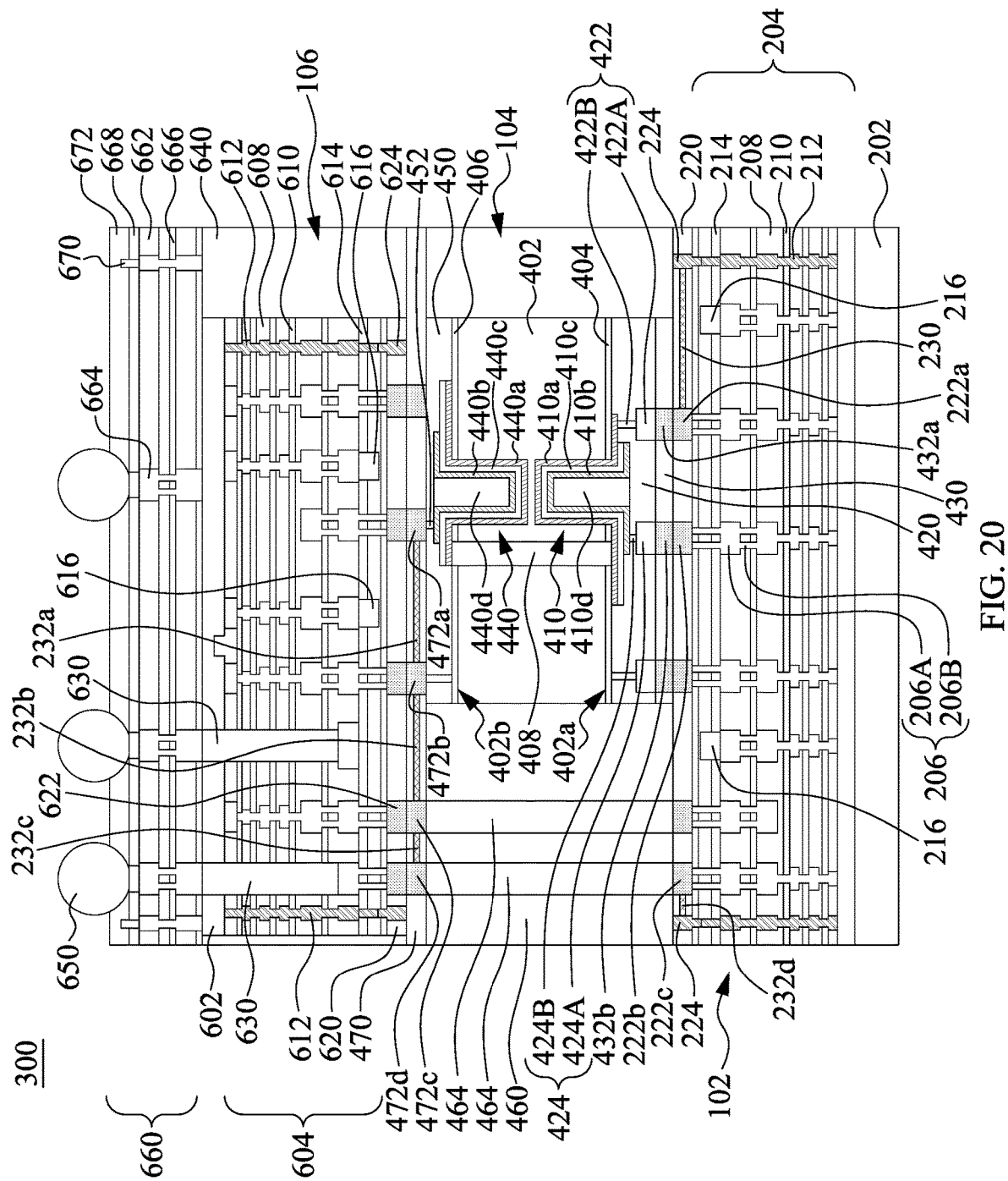
FIG. 20 is a schematic cross-sectional view of a semiconductor structure, in accordance with some embodiments of the present disclosure.

FIG. 20 is a schematic cross-sectional view of a semiconductor structure 300, in accordance with some embodiments of the present disclosure. The semiconductor structure 300 shown in FIG. 20 is similar to the semiconductor structure 100 shown in FIG. 16 except that the semiconductor structure 300 includes several fuse structures 232a, 232b, 232c and 232d. In some embodiments, the fuse structures 232a, 232b and 232c are disposed in the bonding layer 470, and the fuse structure 232d is disposed in the bonding layer 220. The fuse structures 232a, 232b, 232c and 232d may be electrically connected to the seal ring 212 through the bonding pads 472a, 472b, 472c and 472d, the through via 464 and the bonding pad 222c. The fuse structure 232a, 232b, 232c and 232d may be formed of similar materials and by similar processes as those for the fuse structure 230. The fuse structure 232a, 232b, 232c and 232d may be electrically connected to the electrical ground through the seal ring 212. In some embodiments, the fuse structures 230, 232a, 232b, 232c and 232d are kept shorted or are not blown yet during the processing of the first integrated circuit component 102, the second integrated circuit component 104 and the third integrated circuit component 106. In some embodiments, the fuse structures 230, 232a, 232b, 232c and 232d are blown after the processing of the first integrated circuit component 102, the second integrated circuit component 104 and the third integrated circuit component 106.

The fuse structures 230, 232a, 232b, 232c and 232d may be electrically connected to different conductive layers of the second capacitor 440. For example, the first conductive layer 440a of the second capacitor 440 is electrically connected to the fuse structure 230 through the through via 408, the first conductive layer 410a of the first capacitor 410, the conductive pattern 422, the bonding pad 432a and the bonding pad 222a. The second conductive layer 440b of the second capacitor 440 is electrically connected to the fuse structure 232d through the conductive pattern 452, the bonding pad 472a, the fuse structure 232a, the bonding pad 472b, the fuse structure 232b, the bonding pad 472c, the fuse structure 232c, the bonding pad 472d, the through via 464 and the bonding pad 222c. With the additional discharge path formed by the fuse structures 232a, 232b, 232c and 232d, the charges accumulated in the second conductive layer 440h of the second capacitor 440 may flow to the electrical ground more efficiently. Thus, the charge-induced damages can be mitigated.

Figure 21:
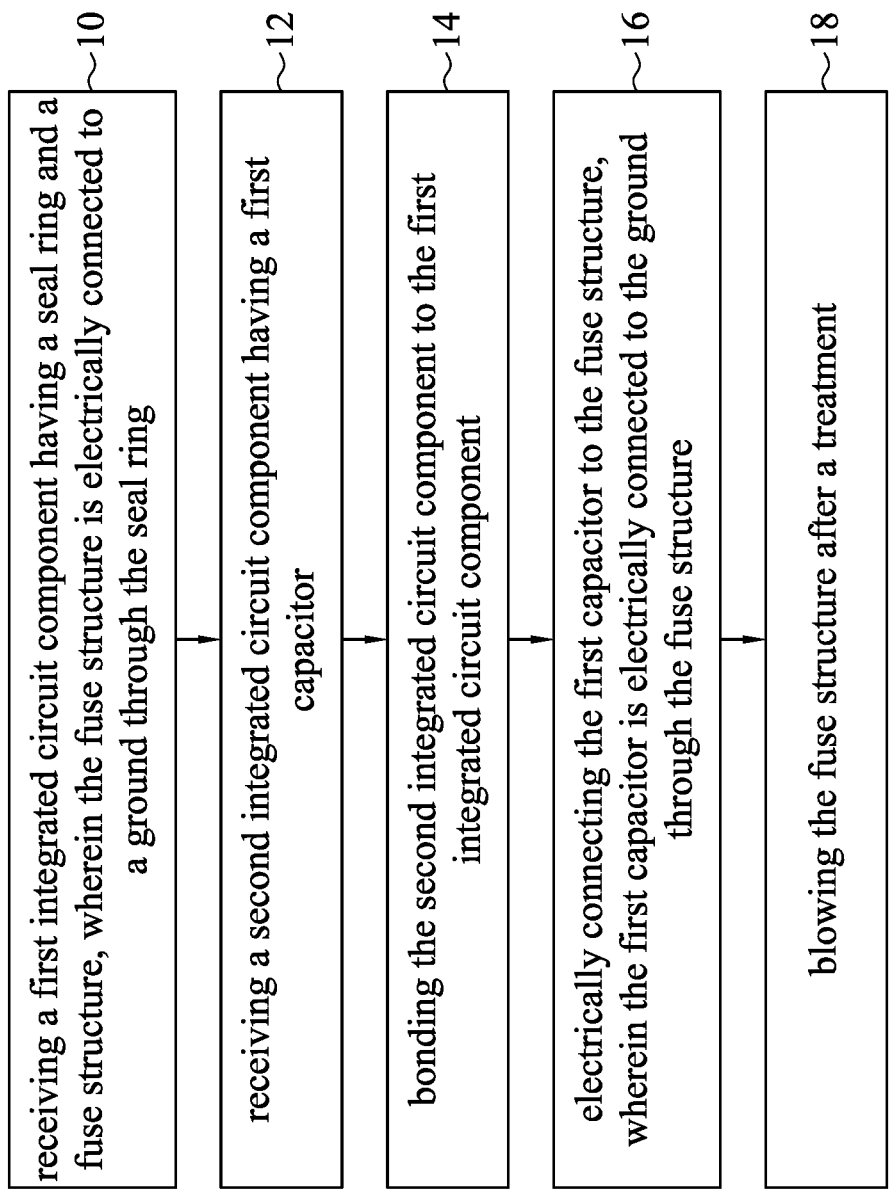
FIG. 21 is a flowchart of a method for forming a semiconductor structure, in accordance with some embodiments of the present disclosure.

FIG. 21 is a flowchart of a method 1 for forming a semiconductor structure, in accordance with some embodiments of the present disclosure. It is understood that additional steps can be provided before, during, and after the method 1, and some of the steps described can be replaced or eliminated for other embodiments of the method. The method 1 for forming a semiconductor structure includes an operation 10 where a first integrated circuit component is received. In some embodiments, the first integrated circuit component includes a seal ring and a fuse structure. In some embodiments, the fuse structure is electrically connected to an electrical ground through the seal ring. The method 1 further includes an operation 12 where a second integrated circuit component is received. In some embodiments, the second integrated circuit component includes a first capacitor. The method 1 further includes an operation 14 where the second integrated circuit component is bonded to the first integrated circuit component. The method 1 further includes an operation 16 where the first capacitor is electrically connected to the fuse structure. In some embodiments, the first capacitor is electrically connected to the electrical ground through the fuse structure. In some embodiments, the method further includes an operation 18 where the fuse structure is blown after a treatment.

Figure 22:
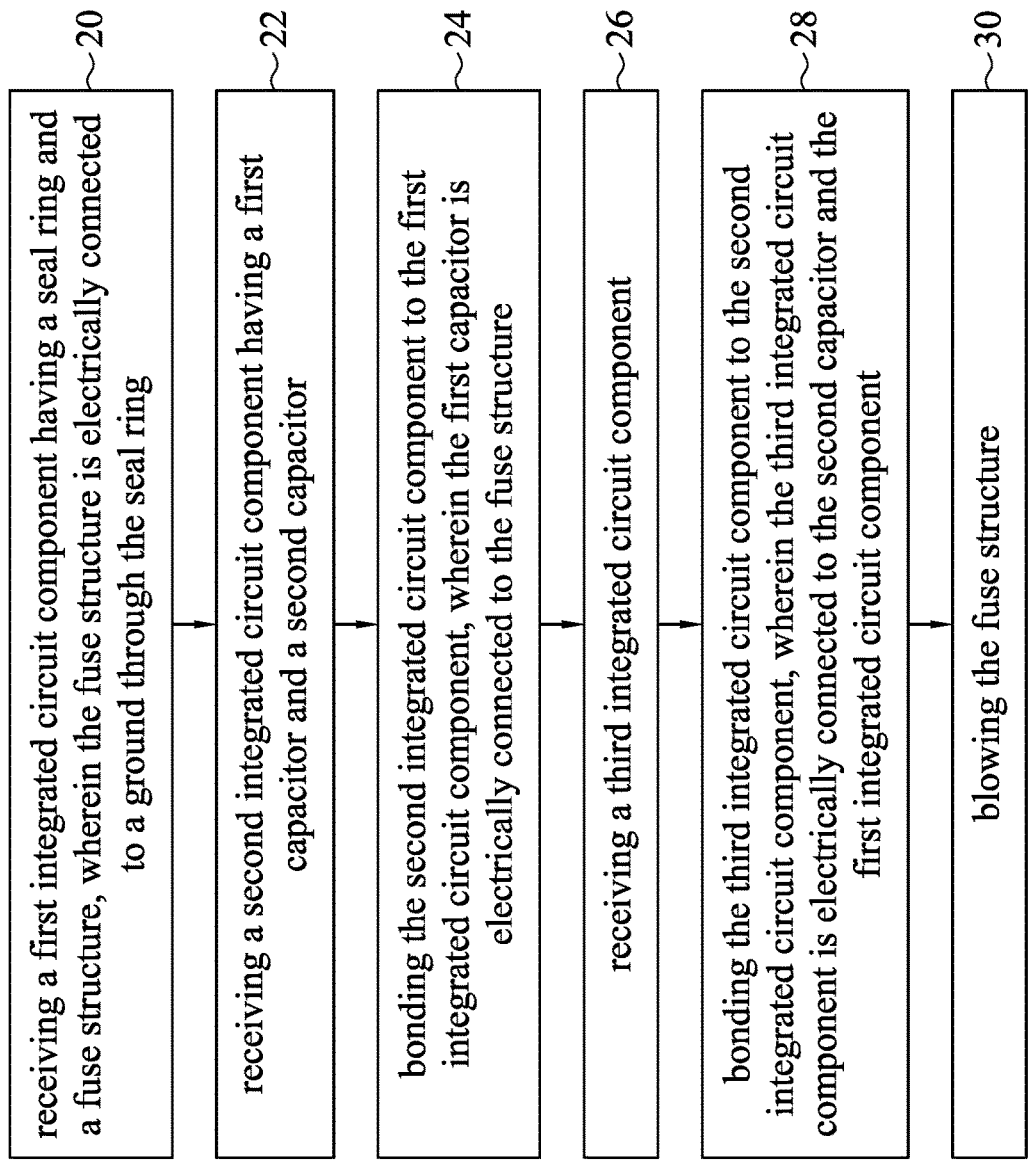
FIG. 22 is a flowchart of a method for forming a semiconductor structure, in accordance with some embodiments of the present disclosure.

FIG. 22 is a flowchart representing a method 2 for forming a semiconductor structure, in accordance with some embodiments of the present disclosure. It is understood that additional steps can be provided before, during, and after the method 2, and some of the steps described can be replaced or eliminated for other embodiments of the method. The method 2 for forming a semiconductor structure includes an operation 20 where a first integrated circuit component is received. In some embodiments, the first integrated circuit component includes a seal ring and a fuse structure. In some embodiments, the fuse structure is electrically connected to an electrical ground through the seal ring. The method 2 further includes an operation 22 where a second integrated circuit component is received. In some embodiments, the second integrated circuit component includes a first capacitor and a second capacitor. The method 2 further includes an operation 24 where the second integrated circuit component is bonded to the first integrated circuit component. In some embodiments, the first capacitor is electrically connected to the fuse structure. The method 2 further includes an operation 26 where a third integrated circuit component is received. The method 2 further includes an operation 28 where the third integrated circuit component is bonded to the second integrated circuit component. In some embodiments, the third integrated circuit component is electrically connected to the second capacitor and the first integrated circuit component. In some embodiments, the method further includes an operation 30 where the fuse structure is blown.

By using the fuse structure and method of the present disclosure, the charge accumulation problem can be mitigated. As the electrically floating structure in the device dies are electrically connected to the electrical ground though the fuse structures, the charges accumulated in the electrically floating structure may be directed to the electrical ground. The fuse structure may be blown after the processes which induces charges accumulation. Thus, the electrical circuit design of the semiconductor structure may not be influenced by the fuse structure.

According to an embodiment, a method for forming a semiconductor structure is provided. The method includes receiving a first integrated circuit component having a seal ring and a fuse structure, wherein the fuse structure is electrically connected to a ground through the seal ring; receiving a second integrated circuit component having a first capacitor; bonding the second integrated circuit component to the first integrated circuit component; electrically connecting the first capacitor to the fuse structure, wherein the first capacitor is electrically connected to the ground through the fuse structure; and blowing the fuse structure after a treatment.

According to an embodiment, a method for forming a semiconductor structure is provided. The method includes receiving a first integrated circuit component having a seal ring and a fuse structure, wherein the fuse structure is electrically connected to a ground through the seal ring; receiving a second integrated circuit component having a first capacitor and a second capacitor; bonding the second integrated circuit component to the first integrated circuit component, wherein the first capacitor is electrically connected to the fuse structure; receiving a third integrated circuit component; bonding the third integrated circuit component to the second integrated circuit component, wherein the third integrated circuit component is electrically connected to the second capacitor and the first integrated circuit component; and blowing the fuse structure.

According to an embodiment, a semiconductor structure is provided. The semiconductor structure includes a first die and a second die. The first die has a first surface. The first die includes a first substrate, a seal ring disposed over the first substrate and a fuse structure including a pair of conductive segments. In some embodiments, the pair of conductive segments are separated by a void and one of the pair of conductive segments is electrically connected to the seal ring. The second die is disposed over the first die. The second die has a second surface bonded to the first surface. The second die includes a second substrate and a capacitor disposed in the second substrate. In some embodiments, the capacitor is electrically connected to the other one of the pair of conductive segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    receiving a first integrated circuit component having a seal ring and a fuse structure, wherein the fuse structure is electrically connected to a ground through the seal ring;
    receiving a second integrated circuit component having a first capacitor;
    bonding the second integrated circuit component to the first integrated circuit component;
    electrically connecting the first capacitor to the fuse structure, wherein the first capacitor is electrically connected to the ground through the fuse structure; and
    blowing the fuse structure after a treatment.

2. The method according to claim 1, wherein the fuse structure is blown by a laser treaty lent.

3. The method according to claim 1, wherein the fuse structure is blown by a current through control of a control circuit.

4. The method according to claim 1, wherein the fuse structure is surrounded by a dielectric layer and a void is formed in the dielectric layer after the fuse structure is blown.

5. The method according to claim 4, wherein a density of the dielectric layer is changed after the fuse structure is blown.

6. The method according to claim 1, wherein the first integrated circuit component further includes a first substrate, and the seal ring and the fuse structure are disposed over the first substrate.

7. The method according to claim 1, wherein the second integrated circuit component further includes a second substrate, and the first capacitor s disposed in the second substrate.

8. The method according to claim 1, wherein the second integrated circuit component further includes a second capacitor electrically connected to the first capacitor through a through silicon via.

9. The method according to claim 1, wherein the fuse structure has a first conductive segment, a second conductive segment and a fuse line between the first conductive segment and the second conductive segment.

10. The method according to claim 1, wherein the treatment includes a charge-induced treatment.

11. A method for forming a semiconductor structure, comprising:
    receiving a first integrated circuit component having a seal ring and a fuse structure, wherein the fuse structure is electrically connected to a ground through the seal ring;

receiving a second integrated circuit component having a first capacitor and a second capacitor;

bonding the second integrated circuit component to the first integrated circuit component, wherein the first capacitor is electrically connected to the fuse structure;

receiving a third integrated circuit component;

bonding the third integrated circuit component to the second integrated circuit component, wherein the third integrated circuit component is electrically connected to the second capacitor and the first integrated circuit component; and blowing the fuse structure.

12. The method according to claim 11, wherein the second integrated circuit component has a first surface facing the first integrated circuit component, and the first capacitor is exposed from the first surface.

13. The method according to claim 12, wherein the second capacitor is exposed from a second surface opposite to the first surface.

14. The method according to claim 11, wherein the second integrated circuit component further comprises a through via electrically connecting the first capacitor to the second capacitor.

15. The method according to claim 11, wherein the second capacitor is electrically connected to the ground through the first capacitor and the fuse structure.

16. The method according to claim 11, further comprising forming a dielectric layer to encapsulate the second integrated circuit component, and forming a through dielectric via in the dielectric layer to electrically connect the third integrated circuit component to the first integrated circuit component.

17. The method according to claim 11, wherein the first integrated circuit component further includes a dielectric layer surrounding the fuse structure, and a void is formed in the dielectric layer after the fuse structure is blown.

18. A semiconductor structure, comprising:
a first die including:
a first substrate;
a seal ring disposed over the first substrate; and
a fuse structure including a pair of conductive segments, wherein the pair of conductive segments are separated by a void and one of the pair of conductive segments is electrically connected to the seal ring; and
a second die disposed over the first die, the second die having a surface bonded to the first die, the second die including:
a second substrate; and
a capacitor disposed in the second substrate, wherein the capacitor is electrically connected to the other one of the pair of conductive segments.

19. The semiconductor structure according to claim 18, wherein the capacitor is exposed from the surface.

20. The semiconductor structure according to claim 18, wherein the second die further comprises a through silicon via disposed in the second substrate, and the capacitor is electrically connected to the other one of the pair of conductive segments through the through silicon via.

* * * * *